(12) United States Patent
Grosser et al.

(10) Patent No.: US 12,394,610 B2
(45) Date of Patent: Aug. 19, 2025

(54) MAGNETRON TARGET COUPLING AND SUPPORT DEVICE

(71) Applicant: VON ARDENNE Asset GmbH & Co. KG, Dresden (DE)

(72) Inventors: Goetz Grosser, Dresden (DE); Steffen Mosshammer, Rabenau (DE); Klaus Schneider, Arnsdorf (DE); Thorsten Sander, Dresden (DE)

(73) Assignee: VON ARDENNE Asset GmbH & Co KG, Dresden (DE)

( * ) Notice: Subject to any disclaimer, the term of this patent is extended or adjusted under 35 U.S.C. 154(b) by 370 days.

(21) Appl. No.: 18/054,560

(22) Filed: Nov. 11, 2022

(65) Prior Publication Data

US 2023/0154733 A1     May 18, 2023

(30) Foreign Application Priority Data

Nov. 12, 2021   (DE) ..................... 10 2021 129 533.5

(51) Int. Cl.
    *H01J 37/34*      (2006.01)

(52) U.S. Cl.
    CPC ...... *H01J 37/3435* (2013.01); *H01J 37/3405* (2013.01)

(58) Field of Classification Search
CPC .. H01J 37/3435; H01J 37/3405; H01J 37/342; H01J 37/345; H01J 37/3455; H01J 37/347; C23C 14/35; C23C 14/3407
See application file for complete search history.

(56) References Cited

U.S. PATENT DOCUMENTS

| | | |
|---|---|---|
| 4,748,379 A | 5/1988 | Agoston |
| 2011/0147209 A1 | 6/2011 | Teschner et al. |

(Continued)

FOREIGN PATENT DOCUMENTS

| | | |
|---|---|---|
| CN | 206986278 U | 2/2018 |
| DE | 102009056241 A1 | 6/2011 |

(Continued)

OTHER PUBLICATIONS

DE102014109991A1 Translation (Year: 2016).*

(Continued)

*Primary Examiner* — James Lin
*Assistant Examiner* — Patrick S Ott
(74) *Attorney, Agent, or Firm* — Viering, Jentschura & Partner mbB

(57) ABSTRACT

Disclosed herein are devices, methods, and systems related to a magnetron-target coupling that includes a target coupling flange, a shaft fixedly coupled to the target coupling flange on a face opposite the target coupling flange, and having a first linear bearing component on a face opposite the target coupling flange. The magnetron-target coupling also includes a communication interface having a first communication electrode and a second communication electrode that are electrically coupled to each other wherein the second communication electrode is fixedly attached to the target coupling flange on a side opposite the shaft, the target coupling flange being disposed between the first communication electrode and the second communication electrode. The first communication electrode is supported such that it may be moved toward and/or away from the second communication electrode.

19 Claims, 13 Drawing Sheets

(56) References Cited

U.S. PATENT DOCUMENTS

| | | |
|---|---|---|
| 2014/0097080 A1 | 4/2014 | Heinrich et al. |
| 2016/0343550 A1 | 11/2016 | Siegert et al. |
| 2022/0157582 A1 | 5/2022 | Humble et al. |

FOREIGN PATENT DOCUMENTS

| | | | |
|---|---|---|---|
| DE | 102014109991 A1 * | 1/2016 | .......... H01J 37/3405 |
| DE | 102015107809 B3 | 7/2016 | |
| EP | 2642669 A1 * | 9/2013 | .............. H01P 1/068 |
| EP | 3137646 A1 | 3/2017 | |
| JP | 201681574 A | 5/2016 | |
| JP | 2019099879 A | 6/2019 | |
| WO | 03023731 A1 | 3/2003 | |
| WO | 2015167687 A1 | 11/2015 | |
| WO | 2020201309 A1 | 10/2020 | |

OTHER PUBLICATIONS

Search report issued for corresponding Belgian patent application No. 2022/5767, dated Apr. 4, 2023, 13 pages (for informational purposes only).

German Search Report issued for the corresponding German patent application No. 10 2021 129 533.5, dated Feb. 24, 2022, 8 pages (for informational purposes only).

* cited by examiner

MAGNETRON TARGET COUPLING AND SUPPORT DEVICE

CROSS-REFERENCE TO RELATED APPLICATION(S)

This application claims priority to German Patent Application No. 10 2021 129 533.5, filed on Nov. 12, 2021, the contents of which are fully incorporated herein by reference.

TECHNICAL FIELD

Various embodiments relate to a magnetron-target coupling and a support/bearing device.

BACKGROUND

In general, workpieces or substrates may be processed, e.g., machined, coated, heated, etched, and/or structurally modified. For example, one process for coating a substrate is cathode sputtering (referred to as sputtering), which is of the physical vapor deposition (PVD) type. By means of sputtering (i.e. by means of a sputtering process), for example, one layer or plurality of layers may be deposited on a substrate. For this purpose, a plasma-forming gas may be ionized by means of a cathode, and a material to be deposited (target material) may be sputtered by means of the plasma formed in the process. The atomized target material may then be brought to a substrate on which it may be deposited and form a layer.

Modifications of cathode sputtering are sputtering by means of a magnetron, so-called magnetron sputtering, or so-called reactive magnetron sputtering. In this process, the formation of the plasma may be supported by means of a magnetic field. The magnetic field may be generated by a magnet system and penetrate the cathode (then also referred to as magnetron cathode), so that a toroidal plasma channel, a so-called racetrack, may be formed on the surface of the target material (target surface), in which plasma may form.

BRIEF DESCRIPTION OF THE DRAWINGS

In the drawings, like reference characters generally refer to the same parts throughout the different views. The drawings are not necessarily to scale, emphasis instead generally being placed upon illustrating the exemplary principles of the disclosure. In the following description, various exemplary aspects of the disclosure are described with reference to the following drawings, in which.

DESCRIPTION

Figure 1:
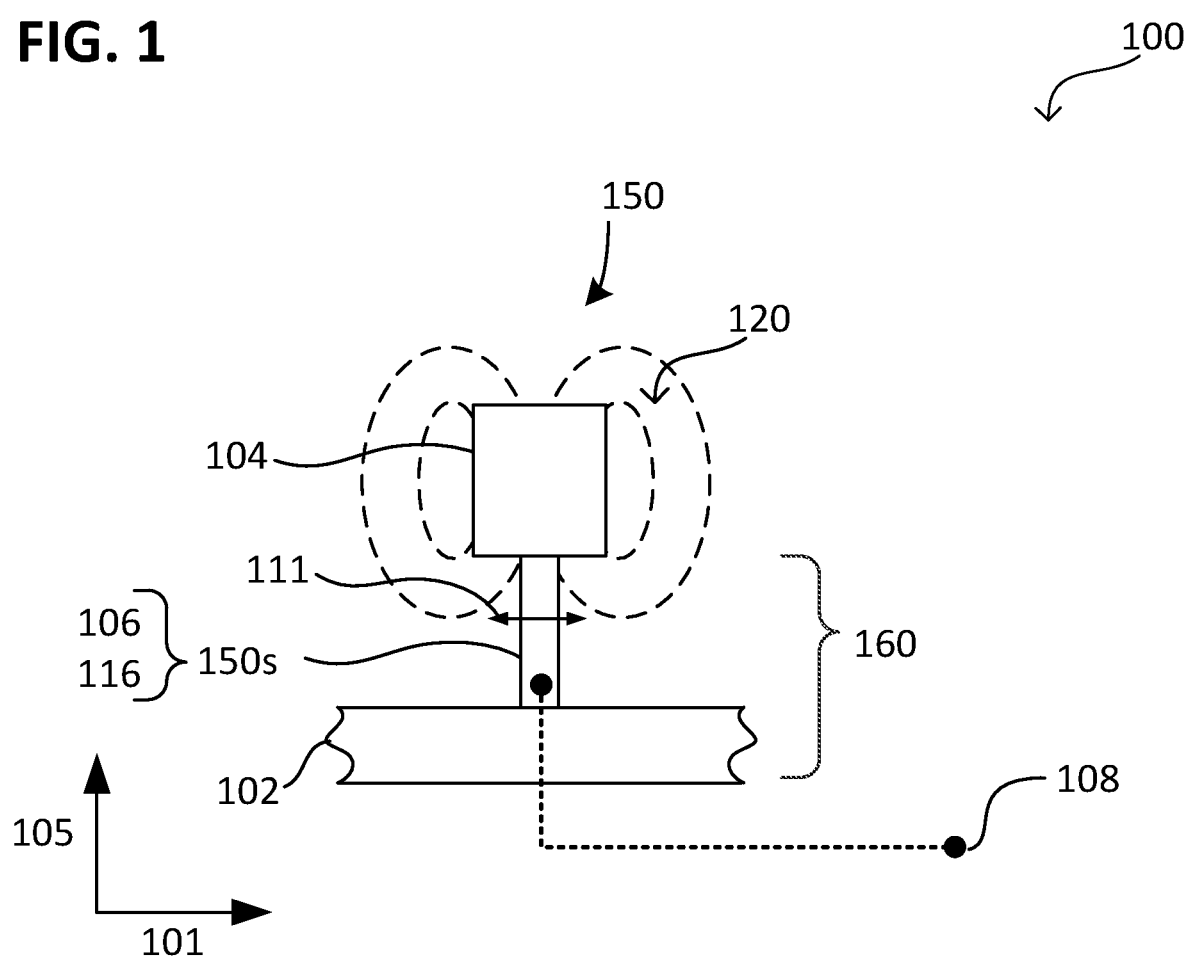
FIGS. 1 and 2 each show a magnet system according to different embodiments in different views.

The following detailed description refers to the accompanying drawings that show, by way of illustration, exemplary details and features.

With respect to magnetic fields and sputtering, the spatial distribution of the plasma or the associated atomization rate depends very sensitively on the spatial distribution of the magnetic field. Therefore, the magnet system is of particular importance with respect to various process properties, such as process stability, reproducibility, target utilization and homogeneity. Against this background, there is a fundamental need to improve the magnet system, for example to simplify it and/or to reduce disturbing influences.

One aspect of various embodiments may be illustratively seen in providing communication with an adjustable magnetic field. By means of adjusting the magnetic field, an atomization of the target material may be influenced, for example in such a way that an atomization and/or coating as uniform as possible may take place. In this respect, it was illustratively recognized that the components used for communication are subject to various disturbances, which makes communication with the magnetic system or adjustment of the magnetic field more difficult.

According to various embodiments, a cohesive assembly is provided in the form of a magnetron-target coupling that includes an axially adjustable communication interface. The communication interface may provide a communicative coupling of the magnetron system with the bearing device so that the magnetron system may be controlled more reliably. Illustratively, the axially adjustable communication interface achieves that tolerances and thermal expansion are better compensated. This reduces interference with communication with the magnet system.

The communication interface is optionally configured for contactless communication with the magnet system or with the bearing device, which reduces wearing or avoids moving sliding contacts.

In the following, reference is made to the accompanying drawings which form part thereof and in which are shown, for illustrative purposes, specific embodiments in which the invention may be practiced. In this regard, directional terminology such as "top", "bottom", "front", "rear", "forward", "rearward", etc. is used with reference to the orientation of the figure(s) described. Since components of embodiments may be positioned in a number of different orientations, the directional terminology is for illustrative purposes and is not limiting in any way. It is understood that other embodiments may be used and structural or logical changes may be made without departing from the scope of protection. It is understood that the features of the various exemplary embodiments described herein may be combined, unless otherwise specifically indicated. Therefore, the following detailed description is not to be construed in a limiting sense, and the scope of protection is defined by the appended claims.

In the context of this description, the terms "connected", "attached" as well as "coupled" are used to describe both a direct and an indirect connection (e.g. ohmic and/or electrically conductive, e.g. an electrically conductive connection), a direct or indirect connection as well as a direct or indirect coupling. In the figures, identical or similar elements are given identical reference signs where appropriate.

According to various embodiments, the term "coupled" or "coupling" may be understood in the sense of a (e.g. mechanical, hydrostatic, thermal and/or electrical), e.g. direct or indirect, connection and/or interaction. For example, a plurality of elements may be coupled together along an interaction chain along which the interaction may be exchanged, e.g., a fluid (then also referred to as fluidically coupled). For example, two coupled elements may exchange an interaction with each other, e.g., a mechanical, hydrostatic, thermal, and/or electrical interaction. A coupling of a plurality of vacuum components (e.g., valves, pumps, chambers, etc.) to each other may have them fluidically coupled to each other. According to various embodiments, "coupled" may be understood in the sense of a mechanical (e.g., bodily or physical) coupling, e.g., by means of direct physical contact. A coupling may be configured to transmit a mechanical interaction (e.g., force, torque, etc.).

The term "bearing device" as used herein means a device (for example comprising an assembly) configured for bearing (e.g. guided positioning and/or holding) one or more than one component. The bearing device may comprise, for example per component (which is supported by means thereof), one or more than one bearing for supporting (e.g. guided positioning and/or holding) the component. Each bearing of the bearing device may be configured to provide the component with one or more than one degree of freedom (for example, one or more than one translational degree of freedom and/or one or more than one rotational degree of freedom) according to which the component may be moved. Examples of a bearing have: Radial bearing, thrust bearing, radial-axial bearing, linear bearing (also referred to as linear guide).

The term "sputtering" refers to the atomization of a material (also referred to as coating material or target material), which is provided as a so-called target, by means of a plasma. The atomized components of the target material are thus separated from each other and may be deposited elsewhere, for example to form a layer. Sputtering may be performed by means of a so-called sputtering device, which may have a magnet system (in which case the sputtering device is also referred to as a magnetron). For sputtering, the magnetron may be placed in a vacuum processing chamber so that sputtering may be performed in a vacuum. To this end, the environmental conditions (the process conditions) within the vacuum processing chamber (e.g., pressure, temperature, gas composition, etc.) may be adjusted or controlled during sputtering. For example, the vacuum processing chamber may be or may be configured to be air-tight, dust-tight, and/or vacuum-tight, such that a gas atmosphere having a predefined composition or pressure (e.g., according to a set point) may be provided within the vacuum processing chamber. For example, an ion-forming gas (process gas) or a gas mixture (e.g., of a process gas and a reactive gas) may be or be provided within the vacuum processing chamber. In a reactive magnetron sputtering process, for example, the atomized material may react with a reactive gas (e.g., comprising oxygen, nitrogen, and/or carbon) and the resulting reaction product (e.g., a dielectric) may be deposited.

Sputtering may be performed by means of a so-called tubular magnetron, in which a tubular target (also referred to as a tube target or tubular cathode) containing the target material rotates axially around the magnet system. By adjusting the magnet system or by changing the magnetic field generated by it, the sputtering of the target material and thus the spatial distribution with which the target is ablated may be influenced.

The tubular cathode and the magnet system may be supported by means of a bearing device (also referred to as a target bearing device) that rotatably supports the tubular cathode relative to the magnet system, for example. The bearing device may have, for example, one or more than one end block, each end block of the bearing device holding an end portion of the tubular cathode and magnet system, respectively. The bearing device (e.g., its one or more than one end block) may further provide a supply of electrical power, rotary motion, and/or cooling fluid to the tubular cathode.

According to various embodiments, an end block (then also referred to as a drive end block) of the sputtering device may include a drive train for transmitting rotary motion to the tubular cathode, which may be coupled to a drive, for example. Alternatively or additionally, an end block (also referred to as a media end block) of the sputtering device may be configured to supply and discharge cooling fluid (e.g., a water-based mixture) that may be passed through the cathode.

However, exactly one end block (also referred to as a compact end block) may be used, which has the drive train and fluid line and thus provides the functions of a drive end block and a media end block together. For example, the side of the tube target opposite the compact end block may be freely cantilevered (i.e., freely suspended), or supported by means of a bearing block, which is referred to as a cantilever configuration.

The magnet system may be multipolar, i.e., have multiple magnetic poles. Of the plurality of magnetic poles, a first magnetic pole (also referred to as an outer pole) may extend along a self-contained path (also referred to as a circulatory path) and a second magnetic pole may be disposed within the area enclosed by the circulatory path (also referred to as an inner pole). The circulatory path may be oval-shaped, for example. Each magnetic pole may have a plurality of magnets lined up in series (then also referred to as a series of magnets or a series of magnets), each magnet being magnetized or having a magnetization. For example, each magnetic pole may have at least 10 (e.g., at least 100) magnets per meter. For example, two or more rows of magnets disposed between the end pieces of the magnet system may provide substantially the center region of the magnet system (illustratively, one row provides the inner pole, and one row of magnets on each side of the inner pole provides the outer pole). Generally, the outer pole and the inner pole may be spaced apart from each other and/or may differ from each other in their direction of magnetization and/or in their number of magnets.

The magnet system, e.g. its so-called magnet bar, may optionally have several segments (also referred to as magnet system segment or as magnet system group) arranged one behind the other and/or spatially separated from each other (e.g. multipolar), of which two segments (also referred to as reversing segments or end pieces) are arranged at the end faces (illustratively at the magnet system end) of the magnet system and of which one or more than one optional segment (also referred to as middle piece) is arranged between the end pieces. Reference is made herein by way of example to a magnet system having a plurality of magnet system groups, wherein what is described with respect thereto may also apply to an unsegmented magnet system, or what is described with respect to one magnet system group may apply by analogy to a plurality of magnet system groups, and vice versa.

According to various embodiments, the term "resilient" may be understood with reference to an object being deformable (also referred to as flexible) against a restoring force. The deformability may be or be provided by the resilient object comprising or being made of an elastic material, e.g., an elastomer. Alternatively or additionally, the deformability (e.g., extensibility) may be or be provided by the resilient object comprising or being made of a material having high strength (e.g., flexural strength), e.g., a steel spring. Deformability (e.g., ductility) refers to the ability of the object to deform from an initial state (e.g., initial shape) against the restoring force when subjected to a mechanical load and, when the load disappears, to return to the initial state (e.g., without damage). Starting from the initial state x (e.g., an extent x), the ratio F of the deformation $\Delta x$ (e.g., a change in extent $\Delta x$) to the initial state (e.g., an initial extent), i.e., $\varepsilon = \Delta x/x$, also denotes the relative deformability (also referred to as elongation with respect to extent). According to various embodiments, the resilient object (e.g., the gas guiding structure) may be configured for a relative deformability greater than about 10%, e.g., about 25%, e.g., about 50%, e.g., about 75%.

In the following, the functionality and structure of the magnet system and sputtering device are first explained to simplify the understanding of the magnetron-target coupling provided.

Herein reference is made to a communication interface configured for length compensation, for example by having two electrically coupled communication electrodes whose distance from each other is configured to be variable (e.g. by means of a linear bearing), e.g. such that they may perform an axial relative movement to each other. This configuration is useful if the bearing electrode is fixedly (e.g., rigidly) coupled to the bearing frame (which it does not necessarily have to be). Alternatively or additionally, the distance of the bearing electrode from the bearing frame may be configured variably (e.g. by means of a linear bearing), e.g. in such a way that they may perform an axial relative movement to each other. Then the two electrically coupled communication electrodes of the communication interface may (but do not necessarily have to) be fixedly (e.g., rigidly) coupled to each other.

Thus, it may be understood that what is described herein with respect to the relative movement of the two electrically coupled communication electrodes may apply by analogy to the bearing electrode. More generally, the communication electrode (which is directly opposite the bearing electrode) and/or the bearing electrode may be supported such that a change in the separation distance thereof from each other when the magnetron-target coupling is moved a segment relative to the bearing frame is less than the segment. Similarly, length compensation may be implemented at the end of the target opposite the communication interface, for example, when no relative axial movement is possible between the four electrodes.

FIG. 1 illustrates a magnet system 100 according to various embodiments in a schematic detailed view, e.g., looking at that direction 101 (also referred to as reference direction 101) along which the magnet system 100 is elongated. For example, the magnet system may have a length (extent along the reference direction 101) of more than about 0.5 m (meters) and/or less than about 6 m, e.g., in a range from 2 m about to about 5 m and/or more than 3 m.

The magnet system 100 may include a plurality of magnets 104 and a carrier 160 configured to support the magnets 104 of the magnet system 100. The support structure 160 may include at least one (i.e., one or more than one) carriers 102, 202 (also referred to as magnet carriers or magnet holders), a first carrier 102 (also referred to as a first magnet carrier/holder or system carrier) of which is configured to support one or more than one magnet system group 150 of the magnet system 100 (e.g., magnets 104 thereof).

For example, the magnet system 100 may include one or more than one magnet system group 150 per system support 102, e.g., multiple magnet system groups 150 per system support 102. Each magnet system group 150 may include multiple (e.g., three or more) magnets 104 and may optionally be configured to be adjustable. At least two magnets 104 per magnet system group 150 may differ in their direction of magnetization.

Each adjustably configured magnet system group 150 may include an adjustment device 150s that is, for example, (e.g., partially) disposed between and/or couples the system support 102 and the magnet(s) 104 of the magnet system group 150. The adjustment device 150s may be configured to change a spatial distribution of the magnetic field 120 generated by the magnet system group 150, for example, by changing a spatial distribution (e.g., position and/or orientation) of the magnet(s) 104 of the magnet system group 150. For example, the adjustment device 150s may be a component of the support structure 160 and configured to change the spatial position and/or orientation of at least one magnet of the magnet system 100.

Exemplary components of the adjustment device 150s include: a bearing device 116 (also referred to as a group bearing device) and/or an actuator 106. The adjustment device 150s (e.g., its group bearing device 116 and/or actuator 106) may couple the or each magnet 104 of the magnet system group 150 to the system support 102. The group bearing device 116 may provide the magnets 104 with one or more than one translational degrees of freedom 111, of which a first translational degree of freedom 111 may be along the reference direction 101 and/or one or more than one second translational degrees of freedom may be transverse to the reference direction 101.

Further, the support structure 160 may include, e.g., per magnet system group 150, a second carrier 202 (also referred to as a second magnet carrier/holder or a group carrier) that couples the plurality of magnets 104 (see also FIG. 2) to each other and/or to the adjustment device 150s. In that case, the or each group carrier 202 may be magnetic (then providing the so-called return carrier) and the system carrier 102 may be non-magnetic.

The actuator 106 may be configured to mechanically move the magnets 104 according to one or more than one translational degrees of freedom 111 (also referred to as actuation). To this end, the actuator 106 may be coupled to the magnet 104 and/or the system support 102 such that when the actuator 106 is actuated, a position (i.e., orientation and/or position) of the magnet 104 relative to the system support 102 may be changed, e.g., according to a desired state.

To generate the motion, the actuator 106 may include an electromechanical transducer (e.g., an electric motor or piezoelectric actuator). The electromechanical transducer may be configured to generate translational motion (e.g., in the case of a linear electric motor) or to generate rotational motion (e.g., in the case of a rotary electric motor). To transmit motion to the magnets 104, the actuator 106 may optionally include a gearbox (also referred to as an actuator).

To supply electrical power (also referred to as supply power) to the actuator 106 and/or to supply a communication signal to the actuator 106, the actuator 106 may be coupled to one or more than one electrical line 108. In principle, the communication signal and the supply power may be supplied together via one line 108, but need not be. They may also be supplied via separate lines 108.

Figure 2:
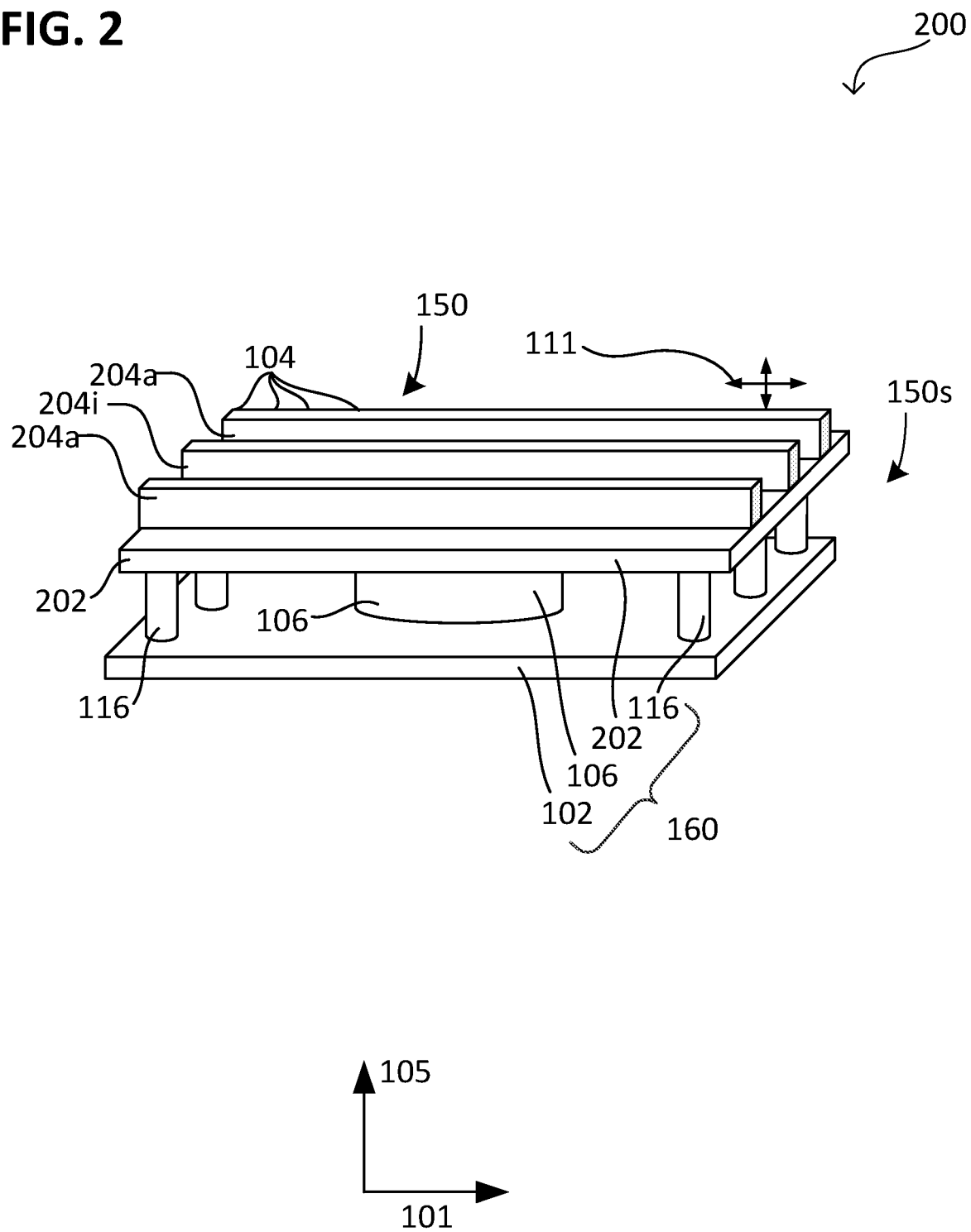

FIG. 2 illustrates the magnet system 100 according to various embodiments 200 in a schematic perspective view, in which the magnet system 100, e.g., each of its magnet system groups 150, comprises a plurality of spatially separated magnet rows 204a, 204i mounted on (e.g., magnetically coupled to) a common group support 202. Each of the magnet rows 204a, 204i may have a plurality of magnets of the same magnetization direction arranged in series one behind the other. At least the middle magnet row 204i, which is arranged between two magnets of the outer magnet row 204a, may be elongated in the reference direction 101.

Figure 3A:
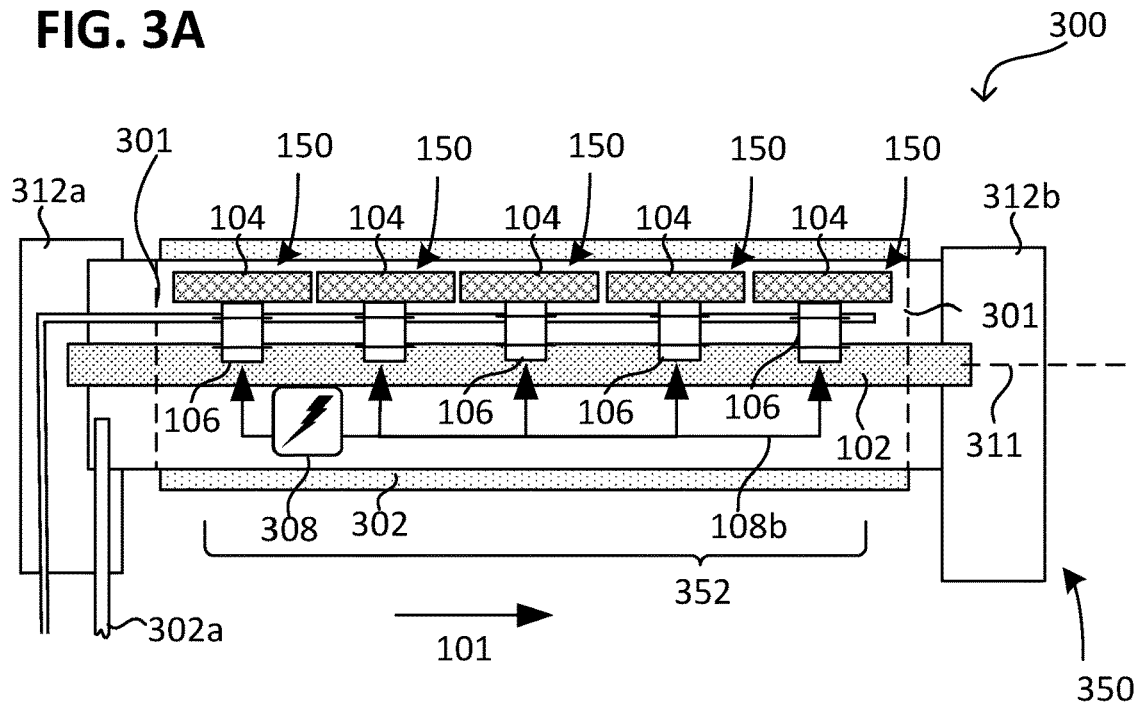
FIG. 3A shows a sputtering device according to different embodiments in various schematic views.
Figure 3B:
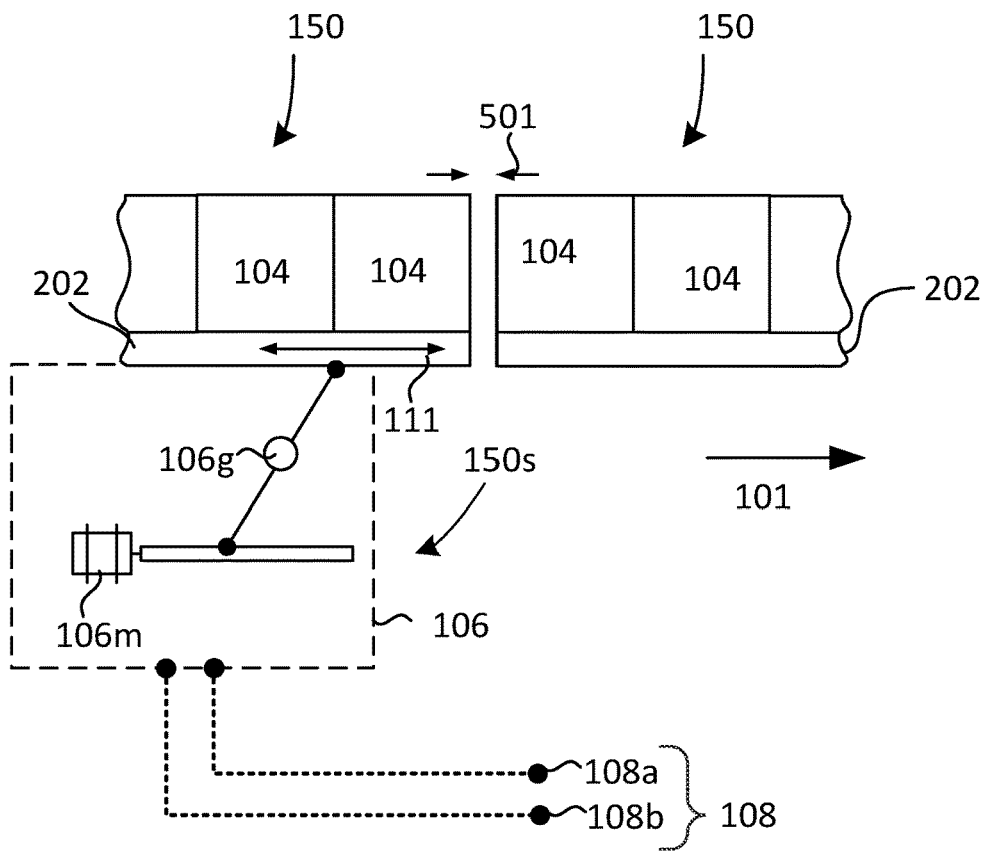
FIG. 3B shows a magnet system of the sputtering device.

FIG. 3A illustrates a sputtering device 300 according to various embodiments in a schematic side view or cross-sectional view, and FIG. 3B illustrates the magnet system 100 of the sputtering device 300 in a schematic detailed view 300b.

The sputtering apparatus 300 may include a bearing device 350 (also referred to as a target bearing device) for rotatably supporting a tubular target 302 (also referred to as a tube target). The target bearing device 350 may include one or more than one end block 312a, 312b by means of which the tubular target 302 may be rotatably supported, e.g., about an axis of rotation 311, and/or supplied. For this purpose, the target bearing device 350 (e.g., each end block 312a, 312b) may comprise one or more than one corresponding pivot bearing 950 (see also FIG. 9).

Per rotary bearing 950, the target bearing device 350 may include, for example, a magnetron-target coupling 301 coupled to the rotary bearing 950. The magnetron-target coupling 301 is configured to hold the target 302 and the magnet system 100, such that the target 302 may be rotated around the magnet system 100. For example, the magnetron-target coupling 301 may include a target connection flange 702 (cf. FIG. 7) that is rotatably supported by means of the pivot bearing 950 and to which the tubular target 302 may be coupled. The axis of rotation 311 may be along reference direction 101 or along a shaft axis of the magnetron-target coupling 301.

A first end block 312a of the target storage device 350 may be configured as a drive end block 312a, i.e., having a drive train 302a for rotating the tubular target 302. A second end block 312b of the target bearing device 350 or the first end block 312a may be configured as a media end block 312b, i.e., for supplying and discharging a cooling fluid (e.g., comprising water) and/or for supplying electrical power to the tubular cathode 302. The cooling fluid may be directed through the tubular target 302.

The drive train 302a may be coupled to or include a drive device (e.g., a motor) disposed outside of the drive end block 312a. By means of the drive train 302a, torque may be coupled to the tubular target 302 for driving rotational movement of the tubular target 302.

Further, the sputtering device 300 may include the magnet system 100 held by the bearing device 350, e.g., stationary and/or rotationally fixed relative to a gravitational direction. For example, the magnet system 100 may remain in a fixed orientation with respect to the direction of gravity when the tubular target 302 is rotated (around the magnet system 100).

The bearing device 350 may have a rotatably mounted target connection flange 702 (cf. FIG. 7) per end block 312a, 312b, by means of which the tubular target 302 may be coupled, e.g. to the drive train 302a and/or to the cooling fluid supply (e.g. having one or more than one fluid line). For example, the target connection flange 702 (cf. FIG. 7) may be configured for releasable connection to the target 302, such that assembly and disassembly of the tubular target 302 are possible. The target coupling 301, e.g. its target connection flange 702, may optionally be penetrated by a fixed bearing by means of which the magnet system 100 may be supported.

Detail view 300b illustrates an exemplary pair of magnet system assemblies 150, each magnet system assembly comprising an assembly support 202; a plurality of magnets 104 coupled together (e.g., magnetically) by the assembly support 202; and an electrical actuator 106 configured to adjust the position of the assembly supports 202 and/or the magnets 104 relative to the system support 102 and/or relative to each other in response to the electrical communication signal supplied to the actuator 106. For example, the actuator 106 includes an electric motor 106m and an optional positioning gear 106g. The actuator 106g may couple the motor 106m to the group carrier 202.

Optionally, the magnet system 100 may include an electrical generator 308 configured to supply electrical power (also referred to as supply power) or a supply voltage to each of the actuators 106. To this end, the line 108 may include one or more than one electrical supply lines 108b coupling the generator 308 to each of the actuators 106.

Further, the magnetron-target coupling 301 may include a communication interface 704 that electrically couples (e.g., galvanically decoupled and/or capacitively couples) at least one of the end blocks 312a, 312b to the line 108, e.g., its communication line(s) 108a. For example, the communication interface 704 of the communication line 108a may be used to couple the communication signal from the end block.

Figure 4:
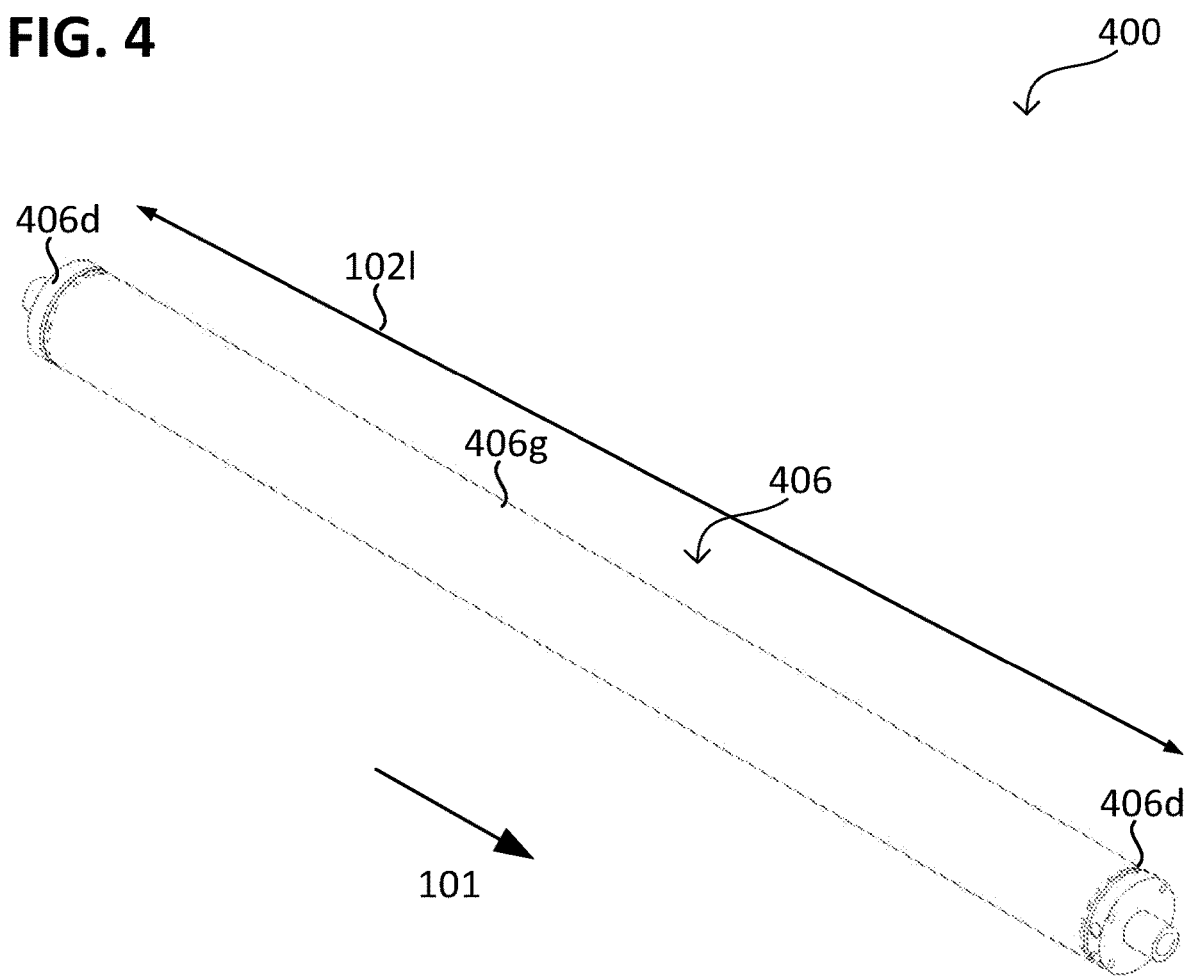
FIG. 4 shows a magnet system according to different embodiments in different views.

FIG. 4 illustrates the magnet system 100 according to various embodiments 400 in a schematic side view or cross-sectional view, in which the magnet system 100 comprises a (e.g., fluid-tight, e.g., vacuum-tight) chamber 406 (also referred to as a system chamber 406) comprising a, e.g., tubular, housing 406g and one or more than one lid 406d (also referred to as a connector lid 406d or housing lid 406d). The or each housing cover 406d may be configured to close (e.g., fluid-tight, e.g., vacuum-tight) the housing 406g at the end face (e.g., out of or in the reference direction 101). Optionally, at least one housing lid 406d of the system chamber 406 may be configured to supply the or each magnet system group 150 of the magnet system 100 (then also referred to as a supply lid), e.g., with the communication signal and/or with the supply power or supply voltage. For this purpose, the supply cover 406d may comprise, for example, a gear stage 804, a generator 308, a communication electrode 406e, and/or a rotary coupling (e.g., a rotor through-coupling or a rotary union), as will be described in more detail with respect to FIG. 6.

Figure 5:
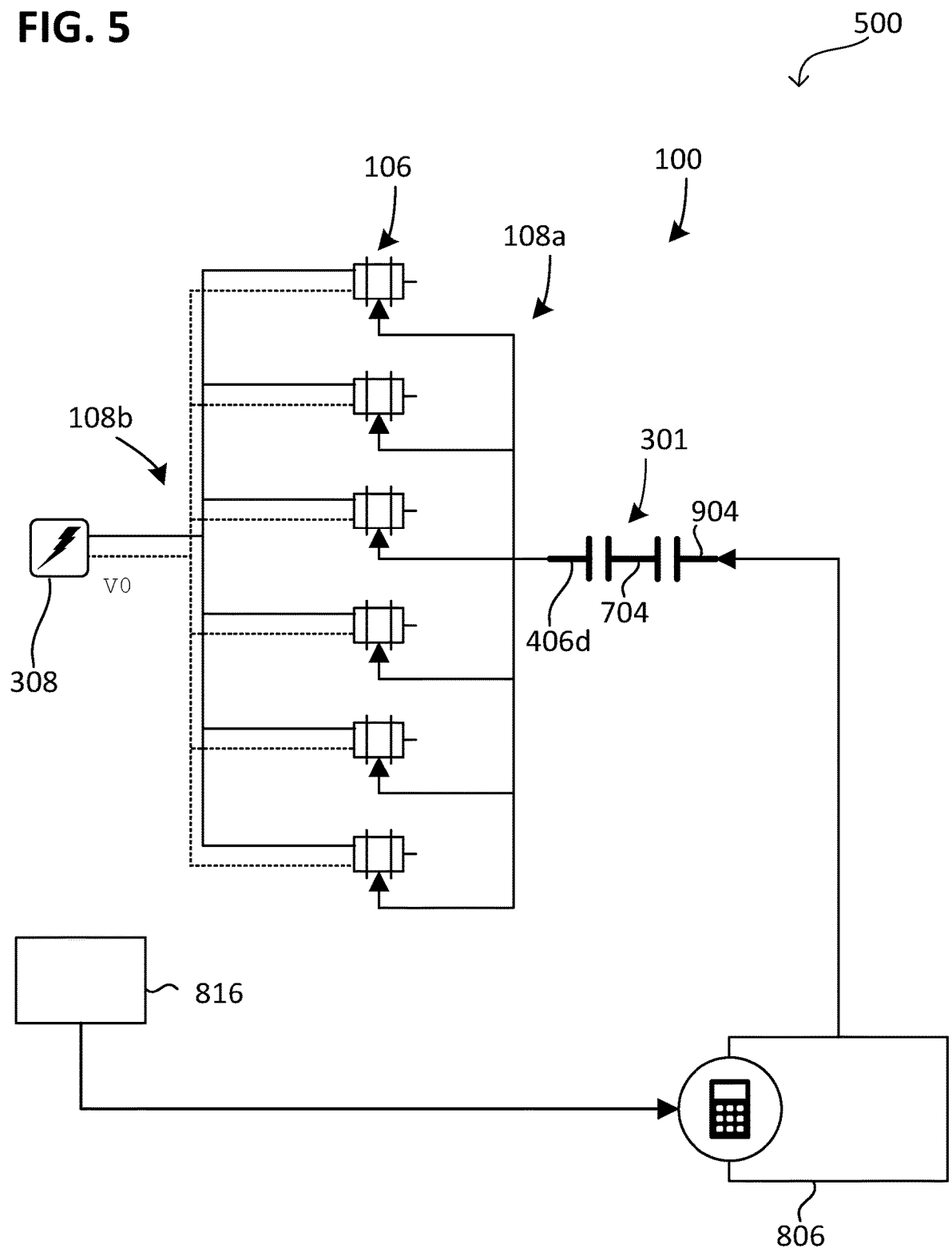
FIG. 5 shows a sputtering device according to different embodiments in various schematic views.

FIG. 5 illustrates the sputtering device 300 according to various embodiments 500 in a schematic circuit diagram. Here, six actuators 106 of the magnetic system 100 are illustrated as an example, although their number may also be greater than or less than six. Optionally, the sputtering device 300 may include a control device 806 (for example, for drive control) that generates the communication signal.

It may be understood that communication between the control device 806 and an actuator 106 of the magnet system 100 may be performed by means of the communication signal, e.g., bidirectionally (i.e., back and forth) or unidirectionally (i.e., only from the control device 806 to the actuator 106). In other words, the communication signal may be the carrier of an information transfer between the control device 806 and an actuator 106.

The communication signal may illustratively be an electrical signal by means of which information may be transmitted (also referred to as communication), for example instructions or control data, measurement data, requests and/or responses. The communication by means of the communication signal may be, on a physical level, by means of an exchange of electrical power. The physical level of communication may be by means of physical transmitters. The communication by means of the communication signal may take place, on a logical level, by means of an exchange of information. The logical level of communication may take place by means of data processing, which may be implemented, for example, by means of a processor and/or a program and/or which controls the transmitters. The exchange of electrical power between the transmitters may, for example, be or become modulated according to the information to be transmitted.

For example, the communication may be message-based (i.e., based on messages) according to a communication protocol (e.g., a network protocol). For example, a fieldbus network protocol may be used as the communication protocol. For example, a USB bus network protocol may be used as the communication protocol (Universal Serial Bus—USB). Of course, another communication protocol may also be used, which may be proprietary, for example.

For example, information transmitted from the control device 806 to the actuator 106 may represent the desired state that the actuator 106 is to assume. Information transmitted from an actuator 106 to the control device 806 may, for example, represent the actual state of the actuator 106 or an acknowledgement of receipt.

The communication line 108a may be coupled to the communication interface 704. The communication interface 704 may be configured to exchange the communication signal between the control device 806 and one or more than one of the actuators 106. In other words, the communication interface 704 may be configured to relay the communication signal. This may generally be accomplished using optical coupling, inductive coupling, and/or capacitive coupling. These achieve more reliable communication. Illustratively, optical, inductive, and/or capacitive relaying of the communication signal may provide galvanic isolation between the actuator 106 and the control device 806. This galvanic isolation inhibits electrical interference during operation of the magnet system 100.

The communication interface 704 may be configured for contactless communication (e.g., transferring information) between stationary and moving parts across a plurality of media spaces and for simultaneous length compensation, as will be discussed in more detail later.

Optionally, the communication interface 704 may be configured such that the one or more than one communication channel is interrupted (i.e., opened) and established (i.e., closed), e.g., alternately interrupted and established, in time with the rotational movement of the tubular target. This causes the communication to be clocked according to the rotational motion of the target (i.e., in time with the rotational motion). This clocking achieves more reliable communication. Illustratively, interference originating in the rotational motion of the tubular target 302 may thus be systematic, making it easier to filter out.

It may be understood that this clocked communication may be implemented at the physical level of communication and/or at the logical level of communication. For example, the resistive, optical, inductive, and/or capacitive coupling may be physically interrupted (i.e., opened) and re-established (i.e., closed), e.g., alternately, in time with the rotational movement of the pipe target. Alternatively or additionally, the logical communication (e.g., sending and/or receiving data or entire messages) may be clocked so that this is interrupted and re-established.

The generator 308 may be configured to generate the supply voltage during operation (for example, at the target rated speed) of the tubular target 302. This supply voltage may be applied to all of the actuators 106 or, by means of a multiplexer, may be applied individually to only one of the actuators 106 at a time, which is actuated. When one of the actuators 106 is driven, the actuator 106 may receive corresponding electrical power from the generator 308, which is applied to adjust the magnetic field.

The magnet system 100 may optionally include one or more than one sensor 816 configured to capture the actual state (also referred to as the process state) of a sputtering process (e.g., coating process) provided by the sputtering device 300 and/or the magnetic field of the magnet system 100. The control device 806 may be configured to control the actuators 106 based on the process state. For example, actuating the actuators 106 may be based on a predetermined target state, such as such that a difference between the process state and the target state is reduced.

Various exemplary implementations of the housing cover 406g, which facilitates the power supply and/or communication implementation described herein, are discussed below.

Figure 6:
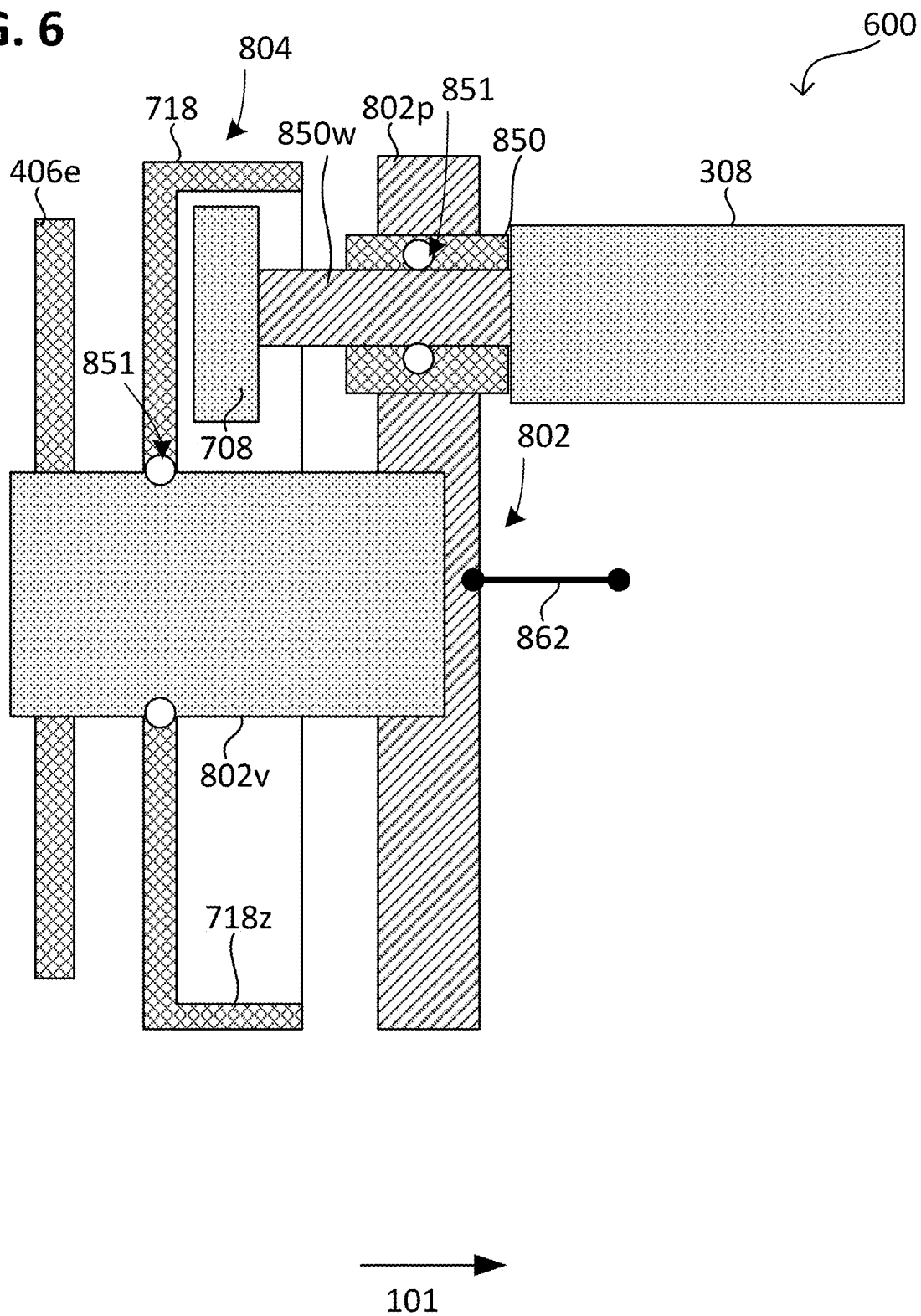
FIG. 6 shows a schematic cross-sectional view of a housing cover of a magnet system according to various embodiments.

FIG. 6 illustrates the housing cover 406d of the magnet system 100 according to various embodiments 600 in a schematic cross-sectional view. In general, the housing cover 406d has a (one-piece or multi-piece) mechanical carrier as the base body 802, which carries the electronic communication and electrical power supply components.

The electrical power supply components include a gear stage 804, a generator 308, and a rotary coupling 850 that couples the gear stage 804 (e.g., its generator gear 708) to the generator 308. The electronic communication components include the communication interface 704 and an electrical connector 862, which are coupled together (e.g., electrically conductive).

In an exemplary implementation of the base body 802, the base body 802 may include a flange 802p and a (e.g., peg-shaped) support device 802v that extends away from the flange 802p and/or is electrically conductive. The support device 802v and the flange 802p may be, for example, fixedly (e.g., rigidly) and/or electrically conductively coupled to each other.

The base body 802 (also referred to as the cover base body) is disposed at least partially (e.g., at least its flange 802p) between the gear stage 804 and the generator 308. The rotary coupling 850 allows an exchange of a rotary motion through a through-hole of the base body 802 (e.g., its flange 802p).

In an exemplary implementation of the electrical terminal 862, it may have one or more than one connection terminal and/or be coupled to one or more than one electrical communication line 108a. Alternatively or additionally, the electrical terminal 862 may be electrically coupled, preferably ohmically, to the lid electrode 406e, e.g., by means of the base body 802 (e.g., its flange 802p and/or its support device 802v).

The gear wheel 718 on the drive side may be supported on the base body 802, e.g. its support device 802v, by means of a rotary bearing 851. Alternatively or additionally, the rotary coupling 850 may have a shaft 850w which is supported by means of a pivot bearing 851 on the main body 802, e.g. its flange 802p.

Figure 12:
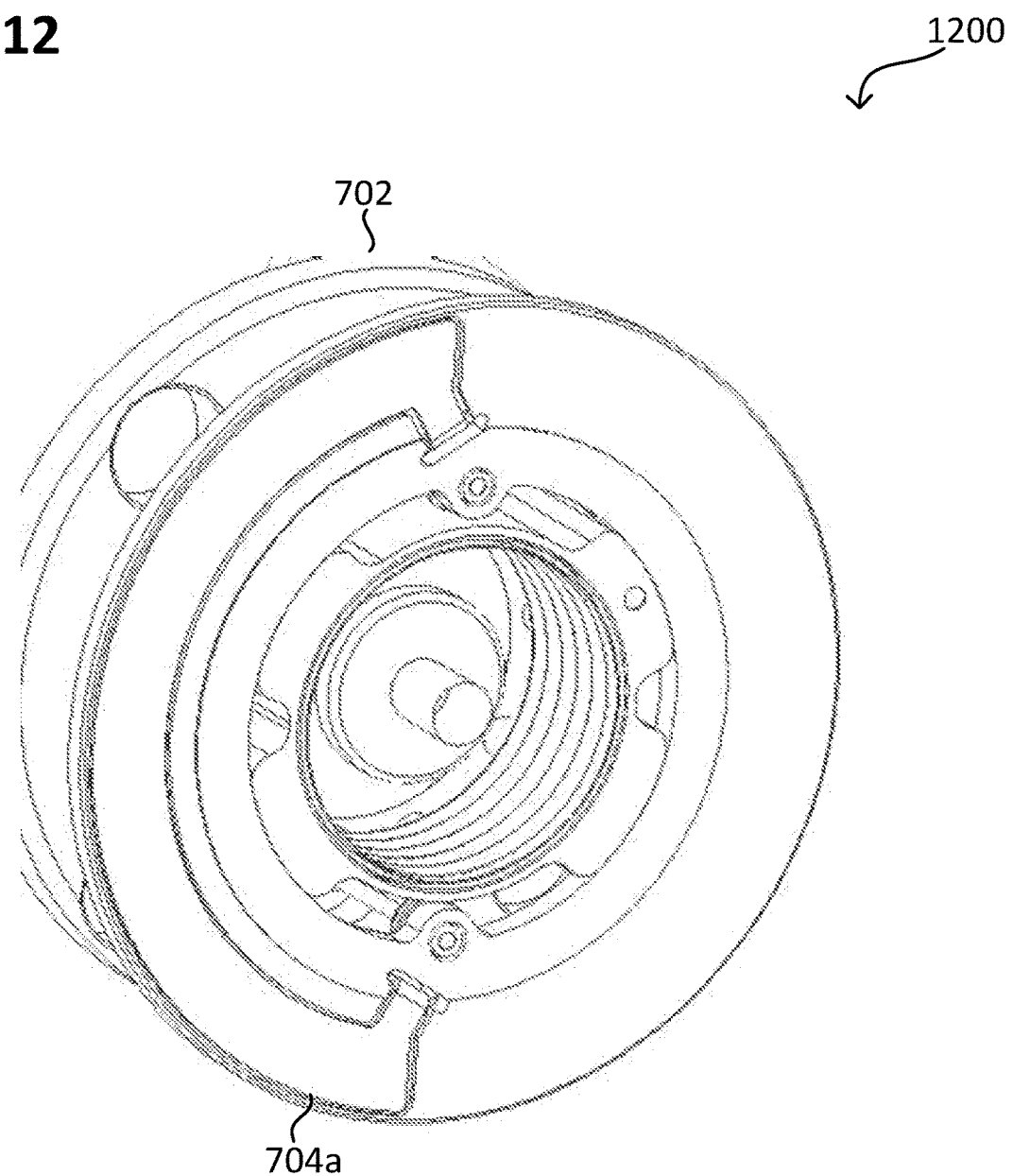
FIG. 12 shows a magnetron-target coupling according to various embodiments in different schematic views.

If the gear stage is internally toothed, its drive-side gear wheel 718 has an internal ring gear 718z (see also FIG. 12). The internal gear rim 718z illustratively provides a recess in which the generator gear 708 may be arranged. This saves installation space.

The provided magnetron-target coupling 301 is explained below, and reference is made to exemplary implementations thereof. It may be understood that the magnetron-target coupling 301 may also be provided as a single assembly, for example, disassembled from the bearing device 350 and/or the magnet system 100.

Figure 7:
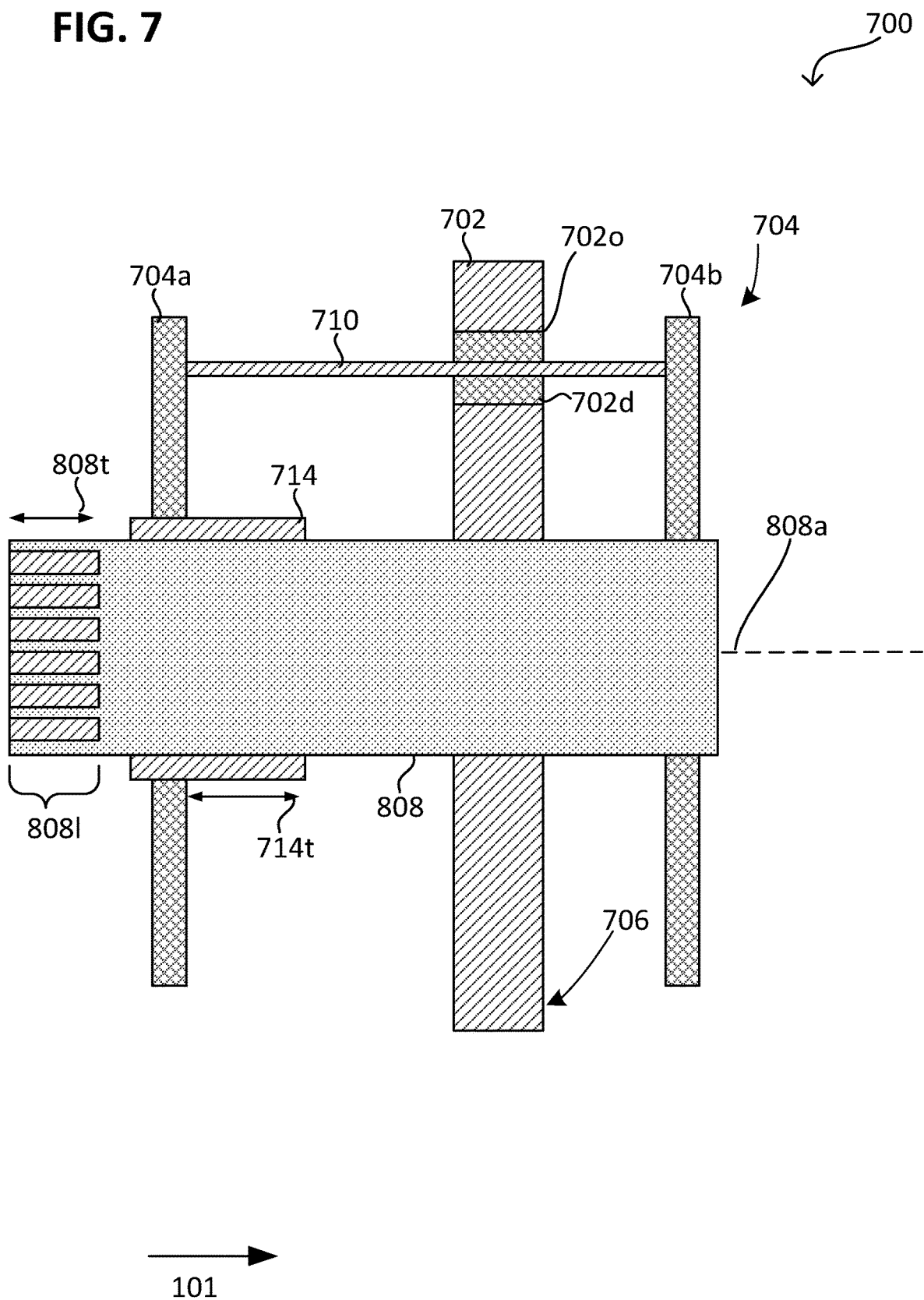
FIG. 7 shows a magnetron-target coupling according to various embodiments in different schematic views.

FIG. 7 illustrates the magnetron-target coupling 301 according to various embodiments 700 in a schematic cross-sectional view.

The magnetron-target coupling 301 includes the flange 702 (also referred to as the target connection flange 702) and a communication interface 704. The communication interface 704 comprises a first electrode 704a (also referred to as first communication electrode 704a) and a second electrode 704b (also referred to as second communication electrode 704b), which are electrically coupled to each other, e.g., by means of an electrical line 710 of the communication interface 704 and/or ohmically.

The target coupling flange 702 may, for example, be penetrated (e.g., along the shaft axis 808a) by a through-hole 702o through which the electrical lead 710 extends. A seal 702d (for example, an O-ring seal) may be disposed in the through-hole 702o, for example, to abut the target coupling flange 702 and the electrical lead 710.

In an exemplary implementation, the or each communication electrode 704a, 704b (e.g., comprising an electrically conductive material, e.g., metal) is configured for capacitive communication. For example, the communication electrode 704a, 704b may be encapsulated (e.g., dielectrically), e.g., using a dielectric. This reduces the need to run a cable along the communication path and/or to hardwire them together.

In the or an exemplary implementation alternative thereto, the or each communication electrode 704a, 704b (e.g., comprising an electrically conductive material, e.g., metal) is disk-shaped and/or plate-shaped or configured as a plate electrode (e.g., a capacitor plate) for capacitive communication. For example, the first communication electrode 704a and/or the second communication electrode 704b may comprise or consist of a disk, ring, or segment thereof.

The magnetron-target coupling 301 further includes a shaft 808 that is fixedly (e.g., rigidly) coupled to the target coupling flange 702.

The shaft 808 may extend along a shaft axis 808a, e.g., through the first communication electrode 704a. The shaft 808 may include a first linear bearing component 8081 (e.g., a rim) on a side opposite the target coupling flange 702. The first linear bearing component 8081 may be configured to mate with a second linear bearing component 8181 (see FIG. 9) to form a linear bearing 918 (also referred to as a shaft support bearing), such as a rotatably supported linear bearing.

The first communication electrode 704a may be disposed between the linear bearing component 8081 and the target coupling flange 702.

The second communication electrode 704b may be fixedly (e.g., rigidly) mounted (e.g., on a side of the target coupling flange 702 opposite the shaft) to the target coupling flange 702 and/or the shaft 808, for example at least partially recessed in the target coupling flange 702 or at least disposed in a recess of the target coupling flange 702. This increases the compactness of the assembly.

According to various embodiments, the first communication electrode 704a is supported by means of a bearing device 714 (also referred to as an electrode bearing device 714). The electrode bearing device 714 may include at least one linear bearing that provides at least one translational degree of freedom to the first communication electrode 704a, for example, relative to the second communication electrode, the shaft 808, and/or the target coupling flange 702. The translational degree of freedom 714t may be, for example, along the shaft axis 808a of the shaft 808 or the reference direction 101.

Illustratively, the translational degree of freedom 714t achieves that the communication electrode 704a (e.g., rotatably mounted) is axially moveable to compensate for tolerances and thermal expansion. This mitigates interference with communication with the magnet system 100.

For example, the electrode bearing device 714 may be configured such that the first communication electrode 704a may be moved toward and/or away from the second communication electrode or target coupling flange 702, for example, along a shaft axis 808a of the shaft 808. Alternatively or additionally, the first communication electrode 704a is mounted such that it may be moved relative to the shaft 808.

The target coupling flange 702 may optionally include a sealing surface 706 distal to the first communication electrode 704a. The sealing surface 706 (e.g., having a groove for receiving a seal) may, for example, abut an elastomeric seal received in the groove, for example. The second communication electrode 704b may be circled by the sealing surface 706, for example.

Additional exemplary implementations of the components of the magnetron-target coupling 301 are discussed below.

In an exemplary implementation of the electrical lead 710, the electrical lead 710 may have or be formed of one or more than one pin 710s (also referred to as a contact pin) and a socket 710b (also referred to as a contact socket) in which the contact pin 710s is received, e.g., formed of a metal. The pin may be moveably supported relative to the first communication electrode 704a by means of a linear bearing, for example, and/or may be configured to be fixedly (e.g., rigidly) supported. This avoids the need for additional cables.

In an exemplary implementation of the electrode bearing device 714, the electrode bearing device 714 may include a resilient element 714f (e.g., a spring) that couples the first communication electrode 704a and the second communication electrode 704b. When the resilient element 714f is deformed (e.g., stretched and/or compressed), the resilient element 714f may generate a restoring force that is directed in the opposite direction of the deformation. The restoring force (measured at constant deformation) may be greater the harder the resilient element 714f is, i.e., the greater its spring constant is.

According to various embodiments, the resilient element 714f may comprise or consist of a resilient material, such as a plastic, such as an elastomer a polymer or a co-polymer, e.g., rubber, silicone, silicone rubber, fluorinated silicone rubber, natural rubber, or other suitable (e.g., soft and/or vacuum compatible) plastic. For example, the polymer or co-polymer may comprise silicon. According to various other embodiments, the resilient material may be metallic, such as steel (e.g., steel spring) or another metal, metal alloy, or intermetallic compound.

In an exemplary implementation of the resilient element 714f, this may have multiple coils, e.g. in the form of a spiral spring or worm spring (see also FIG. 8 below). This is of low complexity and low cost. More generally, the resilient element 714f may have one or more than one spring (e.g., metal spring and/or plastic spring), e.g., in the form of a disc spring, torsion spring, torsion spring, leaf spring, or other spring form.

The restoring force provided by means of the resilient element 710s may be directed against a movement (e.g., translation) of the first communication electrode 704a from an initial position and/or out along the translational degree of freedom 714t. In the initial position, the restoring force may be zero or the first communication electrode 704a may be pressed against a detent by the restoring force.

In an exemplary implementation of the resilient element 710f, the resilient element 710f may be biased. Then, the restoring force may be configured to press the first communication electrode 704a against the detent. For example, the detent may be attached to the shaft 808 and/or be part of the encapsulation of the first communication electrode 704a.

In an exemplary implementation of the linear bearing component 808l, it provides a first segment 808t along which the shaft 808 may be moved. To this end, the linear bearing component 808l may have an extent along the shaft axis 808a equal to or greater than the first segment 808t. For example, the first segment 808t may be about 1 centimeter (cm) or more, such as about 2 cm or more, such as about 4 cm or more, such as about 5 cm or more.

In or an alternative exemplary implementation of the linear bearing component 808l, the linear bearing component 808l includes a torque arm. The torque support may be configured (e.g., when the linear bearing component 808l provides the shaft support bearing) to inhibit rotation of the linear bearing component 808l. For example, the torque restraint may be implemented using a contoured peripheral surface of the linear bearing component 808l. Examples thereof include one or more than one torque support groove and/or one or more than one torque support tooth extending longitudinally along the shaft axis 808a, e.g., around the first segment 808t or more. For example, the linear bearing component 808l may include a rim (e.g., spider) torque arm having an extent along the shaft axis 808a approximately equal to or longer than the first segment 808t, e.g., up to the target coupling flange 702.

In an exemplary implementation of the electrode storage device 714, the electrode storage device 714 may provide the first communication electrode 704a with a second segment 714t by which the first communication electrode 704a may be moved (e.g., along the translational degree of freedom of 714t) relative to the shaft 808. The second segment 714t may be at least 10% of the first segment 808t, e.g., at least 25% of the first segment 808t, e.g., at least 50% of the first segment 808t, e.g., at least 75% of the first segment 808t, e.g., at least 90% of the first segment 808t. For example, the second segment 714t and the first segment 808t may be the same size. The improves the handling of the magnetron-target coupling 301.

In an exemplary implementation of the communication interface 704, it is separated from the target coupling flange 702 and/or the shaft 808, e.g., galvanically separated and/or by means of a dielectric. This improves the signal transmission.

In the or an alternative exemplary implementation of the communication interface 704, the first communication electrode 704a and/or the second communication electrode 704b are encapsulated, e.g., by means of a dielectric. This improves the galvanic isolation and/or the lifetime thereof.

Figure 8:
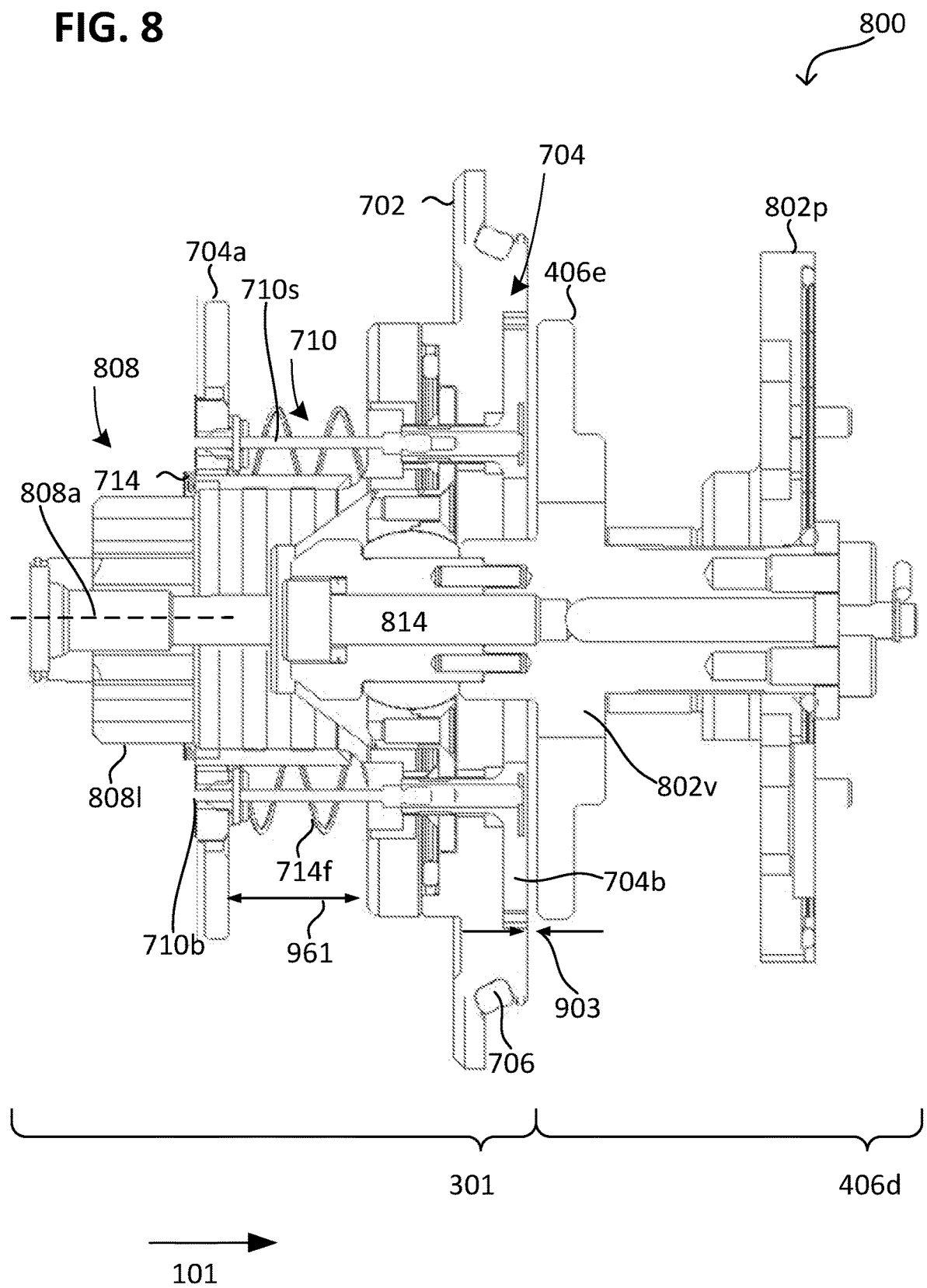
FIG. 8 shows a communication assembly according to different embodiments in different schematic views.

FIG. 8 illustrates a communication assembly 800 according to various embodiments in a schematic cross-sectional view, which includes magnetron-target coupling 301 and housing cover 406d mounted thereto, e.g., as part of sputtering device 300.

The shaft 808 may be rotatably mounted or have the shaft axis 808a about which it is rotatably mounted. Alternatively or additionally, the target coupling flange 702 may be rotatably supported relative to the housing cover 406d, e.g., its cover electrode 406e. To this end, the magnetron-target coupling 301 may include, for example, a mounting structure 814 (e.g., extending along the shaft axis 808a and/or disposed within the shaft 808) that is rotatably mounted relative to and/or supported by the shaft 808.

The mounting structure 814 may be configured to match the housing cover 406d such that it may be attached to the mounting structure 814 (e.g., its base body 802, e.g., its support device 802v).

According to various embodiments, the cover 406d may include a fourth communication electrode 406e (also referred to as a cover electrode) that is electrically coupled, e.g., resistively, to the actuator 106 of the magnet system 100.

For example, the cover electrode 406e may be disposed proximate to the second communication electrode 704b, such as directly opposite thereto and/or at a distance 903 (also referred to as the second electrode-to-electrode distance) therefrom. For example, the second electrode-electrode distance 903 may be approximately equal to the first electrode-electrode distance 903. Alternatively or additionally, the second electrode-electrode distance 903 may be smaller than approximately 1 cm, for example than approximately 0.5 cm, for example than approximately 0.25 cm. This improves communication.

The cover electrode 406e and the second communication electrode 704b may be capacitively coupled to each other, such that they implement a communication path between the control device 806 and the magnet system 100 (e.g., its actuator 106).

According to various embodiments, the cover electrode 406e and/or the bearing electrode 904 may be fixedly (e.g., rigidly) mounted. Relative thereto, the communication interface 704 (e.g., its first communication electrode 704a and/or second communication electrode 704b) may be rotatably mounted, e.g., about the shaft axis 808a and/or concentric with the bearing electrode 904.

The first communication electrode 704a may have a distance 961 (also referred to as an electrode-flange distance) from the target coupling flange 702. The electrode-flange distance may be greater than the first electrode-electrode distance 901 and/or than the second electrode-electrode distance 903, e.g., their sum. The electrode-flange distance may be greater than the first segment 714t. Illustratively, the electrode-flange distance may serve to provide a free space for moving the first communication electrode 704a. Illustratively, the chamber of the electrode-flange spacing 961 serves as a clearance for tolerances and elongation.

Figure 9:
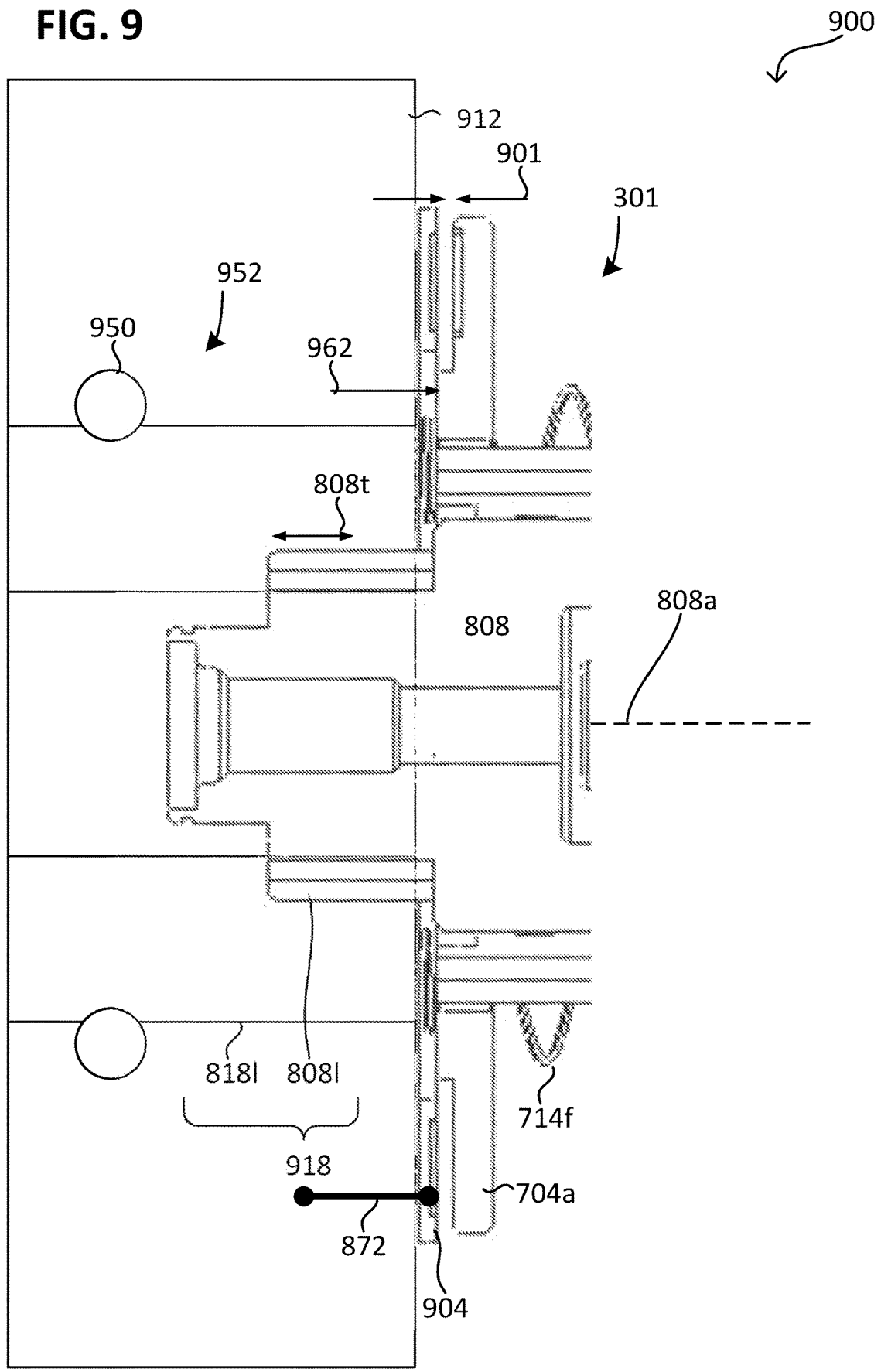
FIG. 9 shows a bearing device according to various embodiments in a schematic cross-sectional view.

FIG. 9 illustrates the bearing device 350 according to various embodiments 900 in a schematic cross-sectional view, e.g., looking at an end block 312a, in which the bearing device 350, e.g., its end block 312a, comprises a base frame 912 (also referred to as a bearing frame 912). The base frame 912 may comprise or consist of, for example, an end block housing. Further, the bearing device 350 comprises the magnetron-target coupling 301, which is only partially shown.

The bearing device 350, e.g., the end block 312*a* thereof, includes a joint 952 supported by the bearing frame 912, the joint 952 including a pivot bearing 950 and a second linear bearing component 8181 rotatably supported by the pivot bearing 950. The second linear bearing component 8181 may be configured to be mated (e.g., nested) with the first linear bearing component 8081 to form the shaft support bearing 918, such that the shaft support bearing 918 is a rotatably supported linear bearing. The shaft receiving bearing 918 may be rotatably supported about the shaft axis 808*a* by means of the rotary bearing 950. The shaft support bearing 918 may provide the translational degree of freedom to the shaft 808 along the first segment 808*t*.

Further, the bearing device 350 may include the bearing electrode 904 (also referred to as the third communication electrode 904) that is fixedly coupled to (e.g., rigidly mounted to) the base frame 912, for example, at least partially recessed within the base frame 912 or at least disposed within a recess of the base frame 912. This increases the compactness of the assembly.

For example, the bearing electrode 904 may be disposed near the first communication electrode 704*a*, e.g., directly opposite thereto and/or at a distance 901 (also referred to as the first electrode-to-electrode distance) therefrom. The first electrode-to-electrode distance 901 may be smaller than, for example, the first segment 808*t* and/or the second segment 714*t* (also referred to as the adjustment distance 714*t*). For example, the first electrode-to-electrode distance 901 may be smaller than about 1 cm, e.g., than about 0.5 cm, e.g., than about 0.25 cm. This improves the communication.

For example, the first electrode-to-electrode distance 901 may be invariant to a displacement of the first communication electrode 704*a* along the of the shaft axis 808*a* and/or according to the translational degree of freedom, which improves communication. This may be achieved, for example, by means of a detent 962, as will be described in more detail later.

The bearing electrode 904 and the first communication electrode 704*a* may be capacitively coupled to each other, such that they implement a communication path between the control device 806 and the magnet system 100 (e.g., its actuator 106).

The bearing electrode 904 may be configured to be galvanically isolated from the communication electrode 704*a* and/or from the base frame 912. For example, the bearing electrode 904 may be encapsulated (e.g., dielectrically), e.g., by means of a dielectric. This improves the galvanic separation and/or the lifetime thereof.

Figure 10:
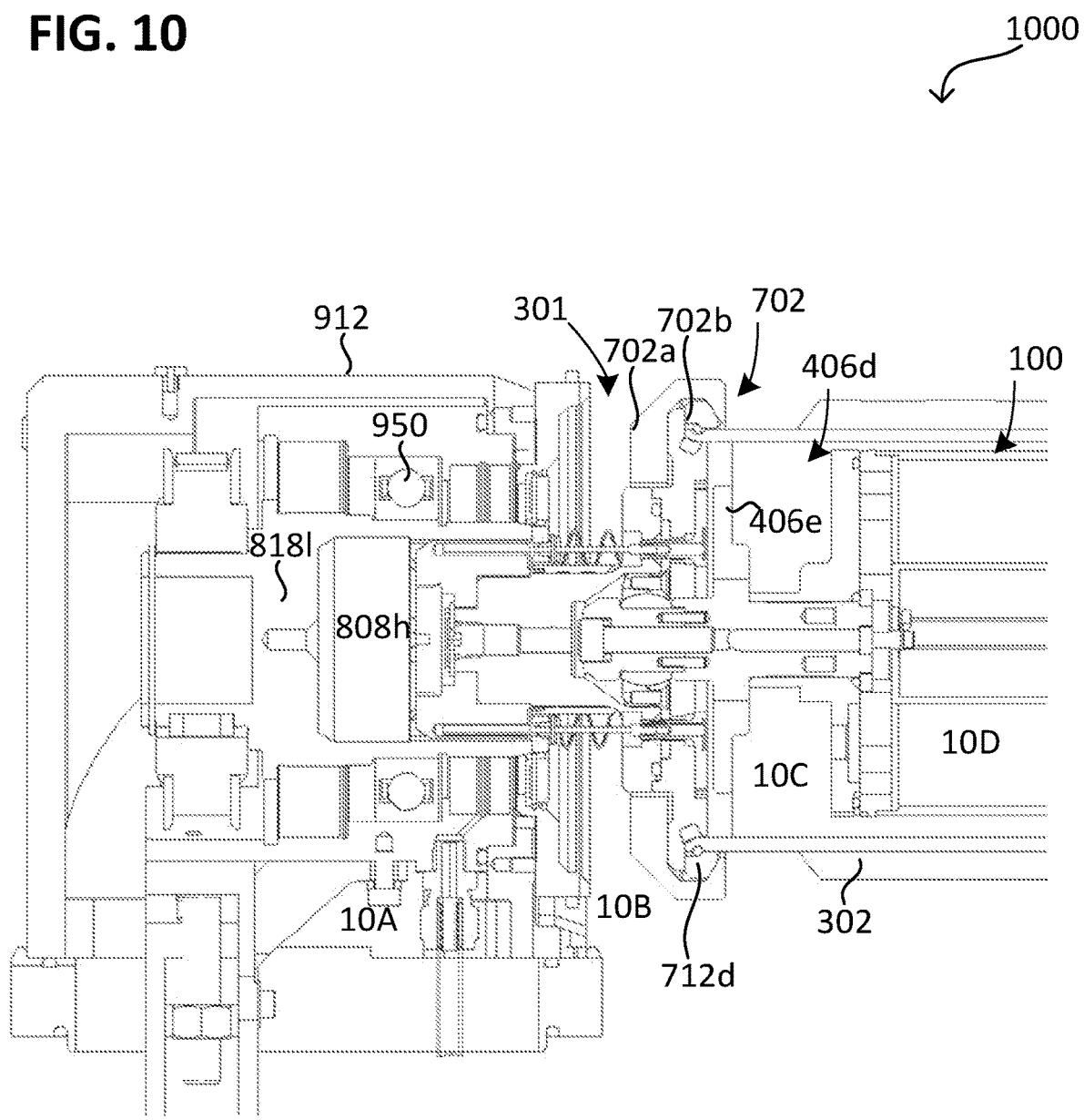
FIG. 10 shows a sputtering device according to different embodiments in various schematic views.

FIG. 10 illustrates a sputtering device 300 according to various embodiments 1000 in a schematic detailed view, in which it comprises a plurality of cavities separated from each other.

The base frame 912 may include a first cavity 10A that has a first (e.g., atmospheric) pressure A during operation. A second cavity 10B may be disposed between the first communication electrode 704*a* and the second communication electrode 704, the second cavity 10B having a vacuum (e.g., a pressure B) during operation.

Pressure B may be less than pressure A and/or than 0.3 mbar, e.g., in a range from about 10 mbar to about 1 mbar (then also referred to as rough vacuum) or less, e.g., in a range from about 1 mbar to about 10-3 mbar (then also referred to as fine vacuum range) or less, e.g., in a range from about 10-3 mbar to about 10-7 mbar (then also referred to as high vacuum range) or less.

A third cavity 10C may be disposed within the target 302, for example between the target 302 and the magnet system 100 and/or between the second communication electrode 704*b* and lid electrode 406*e*, and may include the cooling fluid and/or a pressure C during operation. The pressure C may be greater than pressure A, for example.

Within the magnet system 100, e.g., inside the housing 406*d* (also referred to as the housing interior), a fourth cavity 10D may be arranged that has a fourth (e.g., atmospheric) pressure D during operation. Optionally, the fourth (e.g., atmospheric) pressure D and the first pressure A may differ from each other, i.e., they need not necessarily be identical.

According to various embodiments, the bearing device 350 (e.g., its end block) may include a seal that separates the first cavity 10A from the second cavity 10B. Alternatively or additionally, the magnetron-target coupling 301 (e.g., the target coupling flange 702 thereof) may include the target seal 702*d* that separates the second cavity 10B from the third cavity 10C. Alternatively or additionally, the magnetron system 100 (e.g., its cover 406*d*) may include a seal that separates the third cavity 10C from the fourth cavity 10D.

The communication path between the control device 806 and the magnet system 100 (e.g., to the actuator 106 thereof) may pass through the first cavity 10A, the second cavity 10B, the third cavity 10C, and/or the fourth cavity 10D, e.g., from atmosphere to vacuum to water to atmosphere.

In an exemplary implementation of the target coupling flange 702, the target coupling flange 702 may be multi-part, for example comprising a first flange component 702*a* (e.g., having a recess) and a second flange component 702*b*, between which an annular gap is formed. In the annular gap, the target may be received (e.g., clamped), e.g., frictionally and/or positively held. For example, the two flange components 702*a*, 702*b* may be joined together to form a clamping device (also referred to as a target clamp) for clamping the target 302. Further, an additional target seal 712*d* may abut the sealing surface 706, e.g., disposed in the annular gap and/or between the two flange components 702*a*, 702*b*.

The second linear bearing component 8181 may include a fifth cavity 808*h* in which the first linear bearing component 8081 is received.

Figure 11:
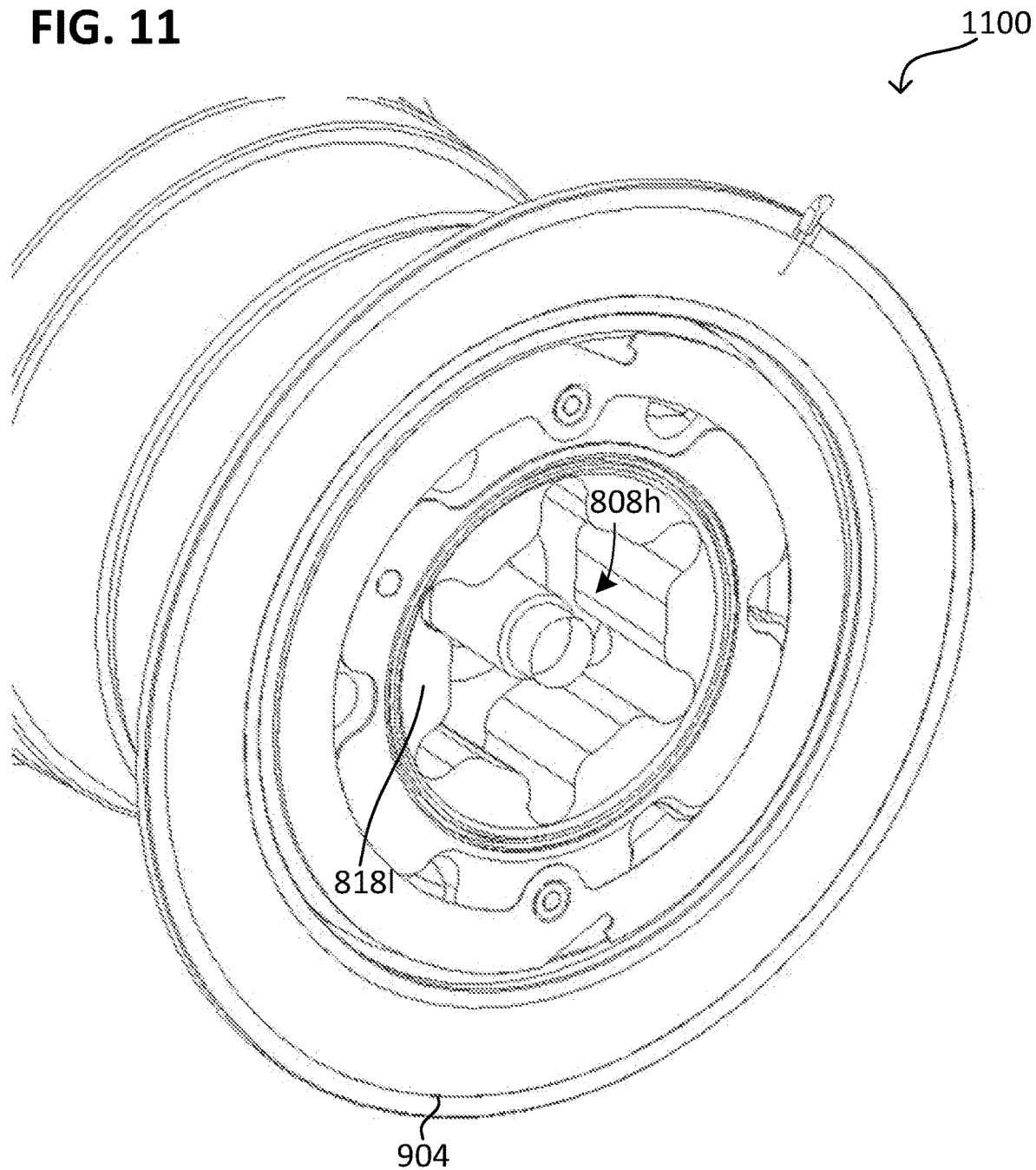
FIG. 11 shows a schematic perspective view of a pivot bearing of the bearing device according to various embodiments.

FIG. 11 illustrates the bearing device 350 according to various embodiments 1100 in a schematic detailed view (looking at the bearing electrode 904), in which the bearing electrode 904 is configured to be annular and/or disc-shaped, e.g., formed in the shape of a ring.

FIG. 12 illustrates the magnetron-target coupling 301 according to various embodiments 1200 in a schematic perspective view (looking at the first communication electrode 704*a*), in which the first communication electrode 704*a* is configured in a segmented and/or disc-shaped manner, e.g., is configured in the form of a ring segment. Optionally, the first communication electrode 704*a* may be embedded in a dielectric.

Figure 13:
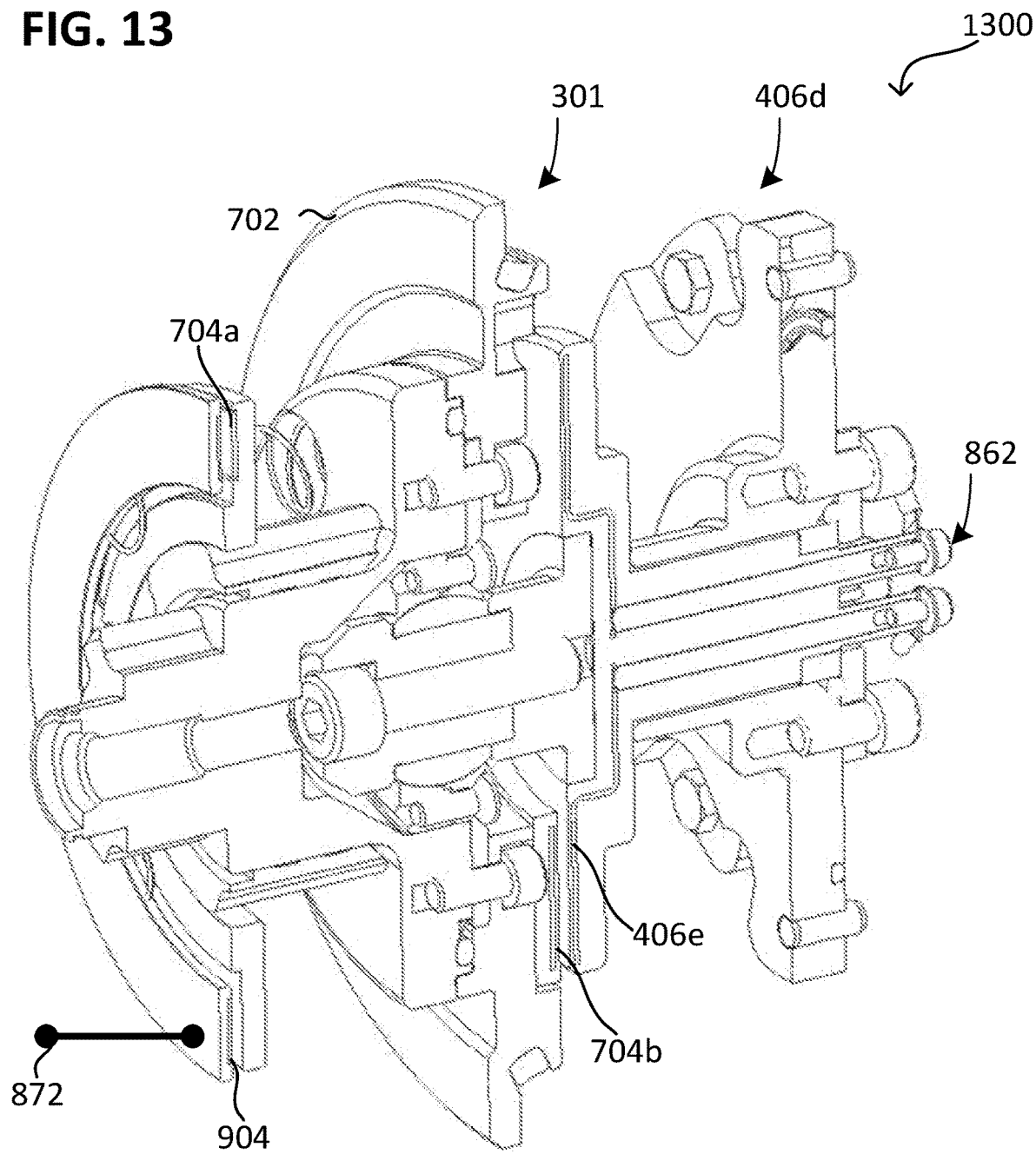
FIG. 13 shows a communication assembly according to different embodiments in different schematic views.

FIG. 13 illustrates a communication assembly 1300 according to various embodiments in a schematic cutaway perspective view comprising magnetron-target coupling 301, housing cover 406*d*, and bearing electrode 904, e.g., as part of sputtering device 300.

In an exemplary implementation, one or more (e.g., each) of the communication electrodes 704*a*, 704*b*, 904, 406*d* is configured to form a circular surface element around the shaft axis 808*a* and is a full or partial surface of a ring (see also FIGS. 11 and 12). Alternatively or additionally, each communication electrode 704a, 704b, 904 is galvanically separated from the components of the flange or base frame 912 adjacent thereto.

The rotating second communication electrode 704b provides an electrical (e.g., capacitive) coupling by means of which the rotating moveable first communication electrode 704a is electrically coupled to the magnetic system 100, e.g., its lid electrode 406e, wherein the electrical coupling is electrically isolated from the cooling fluid (e.g., water) and/or bridges the cooling fluid (e.g., without contact). The electrical coupling therebetween may be configured to be sealing, for example between vacuum and water.

The electrical connection 862 of the cover 406d electrically coupled to the cover electrode 406e is electrically coupled to one or more than one actuator 106 of the magnet system 100, for example, by means of the supply line 108b. The electrical coupling between the electrical connection 862 and the lid electrode 406e may be configured to be sealing, for example between the cooling fluid and the atmosphere.

The components coupled to the target coupling flange 702 on the target side may have tolerances and longitudinal expansion. The axially moveable mounting of the first communication electrode 704a achieves that these tolerances and thermal expansion are better compensated. This reduces disturbances of the communication with the magnet system 100.

The restoring force provided or by means of the resilient element 714f (e.g., having one or more than one spring) may press the first communication electrode 704a against an optional detent 962. This improves the stability of the first electrode-to-electrode distance 901.

The first communication electrode 704a and the second communication electrode 704b are electrically coupled to each other according to various embodiments. The electrical coupling therebetween may be configured to be maintained in any position of the first communication electrode 704a and the second communication electrode 704b relative to each other. This mitigates interference with communication with the magnet system 100. The electrical coupling therebetween may be further configured to seal the second cavity 10B from the third cavity 10B and/or exchange the communication signal between the second cavity 10B and the third cavity 10B. In an advantageous implementation, the electrical coupling therebetween may be provided by means of the contact socket 710b and the contact pin 710s.

The contact pin 710s may move into or out of the contact socket 710b, for example. Optionally, an electrically conductive resilient element may also be arranged in the contact socket 710b, which presses against the contact pin 710s with its restoring force. This improves the electrical contact between contact pin 710s and contact socket 710b. Alternatively or additionally, the contact pin 710s may have a sliding surface with which it lies flat against the contact socket 710b.

For example, the contact pin 710s and contact socket 710b may be electrically isolated from the target coupling flange 702.

Optionally, the target seal 702d may be disposed between the contact pin 710s and the target coupling flange 702.

The outer two communication electrodes (bearing electrode 904 and lid electrode 406e) may each be electrically coupled to electrical connection 862. For example, a first electrical terminal 862 may be electrically coupled, preferably ohmically, to the lid electrode 406e, e.g., by means of the base body 802 (e.g., its flange 802p and/or its support device 802v). For example, a second electrical terminal 872 (see FIG. 9) may be electrically coupled, preferably resistively, to the bearing electrode 904.

In the following, various examples are described that relate to what has been described above and what is shown in the figures.

Example 1 is a magnetron-target coupling, comprising: a target coupling flange (e.g., for coupling a target, e.g., a tubular target); a shaft fixedly coupled (e.g., face-to-face) to the target coupling flange (e.g., extending along a shaft axis away from the target coupling flange and/or toward an end block side), and having, on a side opposite the target coupling flange, respectively on an end portion distal to the target coupling flange, a first linear bearing component (e.g. a rim); a communication interface, which comprises a first communication electrode (e.g. left inner disc), which is preferably arranged between the first linear bearing component and the target coupling flange, and a second communication electrode (e.g. right inner disc), which is electrically (e.g., resistively) connected to one another, wherein the second communication electrode (e.g. on a side distal to the shaft or at least the linear bearing component thereof) is fixedly coupled (e.g. fastened) to the target coupling flange, wherein the target coupling flange is arranged between the first communications electrode and the second communications electrode, wherein the first communications electrode preferably: in a manner (e.g., movable relative to shaft and/or rotatably secured to shaft) attached, such that the second communications electrode may be moved towards and/or away from this way (e.g. along a shaft axis of the shaft); or is fixedly coupled to the shaft and/or to the second communication electrode.

Example 2 is the magnetron-target coupling of example 1, wherein the first communication electrode and/or the second communication electrode comprise a plate and/or are encapsulated.

Example 3 is the magnetron-target coupling of example 1 or 2, further comprising: a resilient element (e.g., comprising one or more than one spring) coupling the first communication electrode and the second communication electrode such that the first communication electrode may be moved toward the second communication electrode against a restoring force of the resilient element.

Example 4 is the magnetron-target coupling according to any one of examples 1 to 3, further comprising: a mechanical detent that limits a segment by which first communication electrode and the second communication electrode may move apart from each other; wherein the detent is preferably fixedly coupled to the shaft or the first communication electrode; and/or wherein preferably the resilient element presses the first communication electrode against the detent or the detent against the bearing device.

Example 5 is the magnetron-target coupling according to any one of examples 1 to 4, wherein a segment (e.g., along the shaft axis) by which the first communication electrode may be moved toward the second communication electrode is equal to greater than 50% of an extent of the linear bearing component parallel to the segment.

Example 6 is the magnetron-target coupling according to any of examples 1 to 5, wherein the linear bearing component includes a torque arm.

Example 7 is the magnetron-target coupling of example 6, wherein the torque arm is elongated toward the target coupling flange and/or includes a ring gear (e.g., external ring gear).

Example 8 is the magnetron-target coupling according to any of examples 1 to 7, wherein the first communication electrode has a recess (e.g., through-hole) through which the shaft extends.

Example 9 is the magnetron-target coupling according to any one of examples 1 to 8, further comprising: a linear bearing by means of which the first communication electrode is moveably supported.

Example 10 is the magnetron-target coupling according to any of examples 1 to 9, wherein the flange includes one or more than one gasket that preferably encircles the second communication electrode.

Example 11 is the magnetron-target coupling according to any one of examples 1 to 10, wherein the first communication electrode is disposed between the first linear bearing component and the target coupling flange.

Example 12 is the magnetron-target coupling according to any of examples 1 to 11, wherein the communication interface is galvanically separated from the target coupling flange and/or the shaft.

Example 13 is the magnetron-target coupling according to any of examples 1 to 12, wherein the first communication electrode or an encapsulation thereof has a through-hole through which the shaft extends.

Example 14 is the magnetron-target coupling according to any one of examples 1 to 13, wherein the second communication electrode has a through-hole exposing a mounting structure (preferably for mounting a magnet system) which is preferably rotatably supported relative to the shaft.

Example 15 is the magnetron-target coupling according to any one of examples 1 to 14, wherein the first communication electrode and/or the second communication electrode comprise or consist of a capacitor plate and/or a plate electrode.

Example 16 is the magnetron-target coupling according to any one of examples 1 to 15, wherein the target coupling flange is multi-part, for example configured to be joined together to provide an annular gap for receiving the target.

Example 17 is a bearing apparatus comprising: a base frame; a magnetron-target coupling according to any one of examples 1 to 16; a rotary bearing supported by the base frame; and a second linear bearing component rotatably supported by the rotary bearing and configured to form a linear bearing when assembled with the first linear bearing component of the magnetron-target coupling so as to provide the magnetron-target coupling with a degree of translational freedom along a rotational axis of the rotary bearing, respectively along the shaft axis; a third communication electrode arranged to face (e.g., capacitively communicate) with the first communication electrode of the magnetron-target coupling.(e.g. capacitively coupled thereto and/or galvanically separated therefrom) to the first communication electrode of the magnetron target coupling when the linear bearing is formed; wherein third communication electrode is preferably: fixedly coupled to the base frame (e.g. when the first communication electrode is preferably mounted such that it may be moved towards and/or away from the second communication electrode) or mounted (e.g. by means of a linear bearing) such that it may be moved towards and/or away from the base frame (for example when the first communication electrode is fixedly coupled to the shaft and/or to the second communication electrode).

Example 18 is a bearing apparatus (e.g., according to example 17), comprising: a base frame; a magnetron-target coupling (e.g., according to any one of examples 1 to 16), comprising: a target coupling flange (e.g., for coupling a target, e.g., a tubular target); a shaft which is rigidly coupled with the target coupling flange (e.g., face-to-face) (e.g., extending along a shaft axis away from the target coupling flange and/or toward an end block side), and has a first linear bearing component (e.g., a rim) on a side opposite to the target coupling flange or at an end portion distal to the target coupling flange; a communication interface comprising a first communication electrode (e.g. left inner disc) preferably arranged between the first linear bearing component and the target coupling flange, and preferably a second communication electrode (e.g. right inner disc) electrically (e.g. resistively) coupled to each other; wherein preferably the second communication electrode (e.g. on a side distal to the shaft or at least the linear bearing component thereof) is fixedly coupled (e.g. fastened) to the target coupling flange, wherein preferably the second communication electrode (e.g. on a side distal to the shaft or at least the linear bearing component thereof) is fixedly coupled (e.g. fastened) to the target coupling flange, preferably with the target coupling flange interposed between the first communication electrode and the second communication electrode; the bearing device further comprising: a rotary bearing supported by the base frame, and a second linear bearing component rotatably supported by the rotary bearing and configured to form a linear bearing assembled with the first linear bearing component of the magnetron-target coupling so as to provide the magnetron-target coupling with a degree of translational freedom along an axis of rotation of the rotary bearing and the first linear bearing component of the magnetron-target coupling, respectively along the shaft axis; a third communication electrode arranged to face the first communication electrode of the magnetron-target and/or is arranged at a separation distance therefrom (e.g. measured along the axis of rotation) when the linear bearing is formed; wherein the first communication electrode and/or the third communication electrode are preferably supported (at least by means of one or more than one translational bearing) such that a change in the separation distance when the magnetron-target coupling is moved according to the translational degree of freedom (e.g., by a segment) relative to the base frame is smaller than the segment (e.g., as 50% of the segment), e.g., is substantially constant, or is at least invariant to moving the magnetron-target coupling according to the translational degree of freedom.

Example 19 is the bearing device of example 17 or 18, wherein the second linear bearing component includes a cavity configured to receive the first linear bearing component.

Example 20 is a sputtering device comprising: a bearing device according to any of examples 17 to 19, preferably comprising one or more than one end block, for rotatably supporting a sputtering target by means of the magnetron-target coupling; an optional magnet system fixedly supported (e.g. relative thereto and/or relative to a gravitational direction) within the sputtering target by means of the bearing device.

Example 21 is the sputtering device according to example 20, the bearing device further comprising: a fixed bearing which carries and/or is coupled to the magnet system through the magnetron-target coupling, e.g. through the shaft thereof.

Example 22 is the sputtering device according to example 20 or 21, wherein the shaft has a through-hole into which the fixed bearing extends.

Example 23 is the sputtering device according to any one of examples 20 to 22, the magnet system comprising: a (e.g. non-magnetic) housing having a housing interior; a (e.g. non-magnetic) magnet holder disposed in the housing interior and supported by the housing, preferably stationary with respect thereto; a (e.g. non-magnetic) housing cover, which forms a fluid-tight chamber when joined to the housing; wherein the housing cover has a fourth communication electrode directly opposite the second communication electrode (e.g. capacitively coupled thereto and/or galvanically separated therefrom) and optionally has a gear stage, a generator and a rotary coupling, which couples the gear stage to the generator.

The invention claimed is:

1. A magnetron-target coupling comprising:
a target coupling flange for coupling a tubular target;
a shaft that is fixedly coupled to the target coupling flange and has a first linear bearing component at an end portion distal from the target coupling flange;
a communication interface comprising:
a first communication electrode disposed between the first linear bearing component and the target coupling flange; and
a second communication electrode electrically coupled to the first communication electrode, wherein the target coupling flange is fixedly coupled to the second communication electrode and disposed between the first communication electrode and the second communication electrode, wherein the first communication electrode is supported such that it may be moved towards and/or away from the second communication electrode.

2. The magnetron-target coupling of claim 1, wherein the first communication electrode or the second communication electrode comprise an encapsulated plate.

3. The magnetron-target coupling of claim 1, the magnetron-target coupling further comprising a resilient element coupling the first communication electrode and the second communication electrode to each other such that the first communication electrode may be moved toward the second communication electrode against a restoring force of the resilient element.

4. The magnetron-target coupling of claim 3, wherein the resilient element is a spring.

5. The magnetron-target coupling of claim 1, the magnetron-target coupling further comprising a mechanical detent that limits a segment by which the first communication electrode and the second communication electrode may move apart from each other.

6. The magnetron-target coupling of claim 5, wherein the detent is fixedly coupled to the shaft or the first communication electrode.

7. The magnetron-target coupling of claim 6, further comprising a resilient element coupling the first communication electrode and the second communication electrode to each other such that the first communication electrode may be moved toward the second communication electrode against a restoring force of the resilient element, wherein the resilient element, when engaged, presses the first communication electrode against the detent or presses the detent against the bearing device.

8. The magnetron-target coupling of claim 1, wherein a segment by which the first communication electrode may be moved toward the second communication electrode is at least 50% of an extent of the linear bearing component parallel to the segment.

9. The magnetron-target coupling of claim 1, wherein the linear bearing component comprises a torque arm.

10. The magnetron-target coupling of claim 9, wherein the torque arm is elongated toward the target coupling flange or includes a ring gear.

11. The magnetron-target coupling of claim 1, wherein the first communication electrode has a recess through which the shaft extends.

12. The magnetron-target coupling of claim 1, wherein the communication interface is galvanically separated from the target coupling flange and/or the shaft.

13. The magnetron-target coupling of claim 1, the magnetron-target coupling further comprising a second linear bearing that moveably supports the first communication electrode.

14. The magnetron-target coupling of claim 1, wherein the second communication electrode has a through-hole that exposes a mounting structure for rotatably supporting a magnet system relative to the shaft.

15. The magnetron-target coupling of claim 1, wherein the target coupling flange includes a gasket that encircles the second communication electrode.

16. A bearing device comprising:
a magnetron-target coupling comprising:
a target coupling flange for coupling a tubular target;
a shaft that is fixedly coupled to the target coupling flange and has a first linear bearing component at an end portion distal from the target coupling flange;
a communication interface comprising:
a first communication electrode disposed between the first linear bearing component and the target coupling flange; and
a second communication electrode electrically coupled to the first communication electrode, wherein the target coupling flange is fixedly coupled to the second communication electrode and disposed between the first communication electrode and the second communication electrode, wherein the first communication electrode is supported such that it may be moved towards and/or away from the second communication electrode;
a base frame;
a rotary bearing supported by the base frame, and a second linear bearing component rotatably supported by the rotary bearing and configured to mate with the first linear bearing component of the magnetron-target coupling to form a linear bearing such that the magnetron-target coupling is provided a degree of translational freedom along an axis of rotation of the rotary bearing; and
a third communication electrode arranged to face the first communication electrode of the magnetron-target coupling when the linear bearing is formed, the third communication electrode being fixedly coupled to the base frame.

17. The bearing device of claim 15, wherein the first communication electrode and/or the second communication electrode comprise a capacitor plate.

18. The bearing device of claim 15, wherein the target coupling flange comprises a plurality of flange parts that are joined together to form an annular gap for receiving the tubular target.

19. A bearing device comprising:
a base frame;
a magnetron-target coupling comprising:
a target coupling flange for coupling a tubular target;
a shaft that is fixedly coupled to the target coupling flange and has a first linear bearing component at an end portion distal from the target coupling flange;
a rotary bearing supported by the base frame, and a second linear bearing component rotatably supported by the rotary bearing and configured to mate with the first linear bearing component of the magnetron-target coupling to form a linear bearing such that the magnetron-target coupling is provided a degree of translational freedom along an axis of rotation of the rotary bearing; and
a communication interface comprising:
   a first communication electrode disposed between the first linear bearing component and the target coupling flange; and
   a second communication electrode electrically coupled to the first communication electrode, wherein the target coupling flange is fixedly coupled to the second communication electrode and disposed between the first communication electrode and the second communication electrode, wherein the first communication electrode is supported such that it may be moved towards and/or away from the second communication electrode; and
an additional communication electrode arranged to face and be spaced from the first communication electrode of the magnetron-target coupling when the linear bearing is formed, wherein the first communication electrode or the additional communication electrode are supported such that a change in a separation distance when the magnetron-target coupling is moved by a segment relative to the base frame according to the translational degree of freedom is smaller than the segment.

* * * * *